(12) United States Patent
Ikeda et al.

(10) Patent No.: US 11,811,002 B2
(45) Date of Patent: Nov. 7, 2023

(54) DISPLAY WITH DUAL RED EMITTERS

(71) Applicant: Japan Display Inc., Tokyo (JP)

(72) Inventors: Masanobu Ikeda, Tokyo (JP); Osamu Ito, Tokyo (JP); Yasuhiro Kanaya, Tokyo (JP); Tadafumi Ozaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 431 days.

(21) Appl. No.: 17/240,469

(22) Filed: Apr. 26, 2021

(65) Prior Publication Data

US 2021/0265530 A1    Aug. 26, 2021

Related U.S. Application Data

(63) Continuation of application No. PCT/JP2019/031531, filed on Aug. 8, 2019.

(30) Foreign Application Priority Data

Nov. 2, 2018  (JP) ................................ 2018-207671

(51) Int. Cl.
*H01L 33/32* (2010.01)
*H01L 25/075* (2006.01)
*H01L 33/06* (2010.01)

(52) U.S. Cl.
CPC .......... *H01L 33/32* (2013.01); *H01L 25/0753* (2013.01); *H01L 33/06* (2013.01)

(58) Field of Classification Search
CPC ..... H01L 33/32; H01L 25/0753; H01L 33/06; H01L 33/08; H01L 25/167; H01L 33/62; H01L 33/325; H01L 33/18; G09F 9/33; G09G 3/20; G09G 3/32
See application file for complete search history.

(56) References Cited

U.S. PATENT DOCUMENTS

| | | | |
|---|---|---|---|
| 2003/0067773 A1 | 4/2003 | Marshall et al. | |
| 2010/0025653 A1 | 2/2010 | Soh et al. | |
| 2012/0077299 A1 | 3/2012 | Nishikawa et al. | |
| 2018/0097033 A1 | 4/2018 | Ahmed et al. | |
| 2019/0229149 A1* | 7/2019 | Yoo | H01L 33/30 |

FOREIGN PATENT DOCUMENTS

| | | |
|---|---|---|
| JP | 2003515956 A | 5/2003 |
| JP | 2009065137 A | 3/2009 |
| JP | 2010503228 A | 1/2010 |
| JP | 2013120848 A | 6/2013 |
| JP | 5388041 B2 | 1/2014 |
| JP | 2015177019 A | 10/2015 |

OTHER PUBLICATIONS

International Search Report dated Nov. 12, 2019 in connection with PCT/JP2019/031531.

* cited by examiner

*Primary Examiner* — J. E. Schoenholtz
(74) *Attorney, Agent, or Firm* — K&L Gates LLP

(57) ABSTRACT

According to an aspect, a display device includes: a substrate; a plurality of pixels provided on the substrate; and a first light emitting element and a second light emitting element that are included in each of the pixels. A light emitting layer of the first light emitting element includes gallium nitride to which europium is added, and a light emitting layer of the second light emitting element includes a multi-quantum well structure in which indium gallium nitride and gallium nitride are layered.

12 Claims, 16 Drawing Sheets

DISPLAY WITH DUAL RED EMITTERS

CROSS-REFERENCE TO RELATED APPLICATION

This application claims the benefit of priority from Japanese Patent Application No. 2018-207671 filed on Nov. 2, 2018 and International Patent Application No. PCT/JP2019/031531 filed on Aug. 8, 2019, the entire contents of which are incorporated herein by reference.

BACKGROUND

1. Technical Field

What is disclosed herein relates to a display device.

2. Description of the Related Art

Widely known are display devices including inorganic light emitting diodes (micro LEDs) serving as display elements. Such display devices include different types of LEDs for respective colors to be displayed. The red LED described in U.S. Patent Application Publication No. 2018-0097033 (US-A-2018-0097033) includes a light emitting layer having a multi-quantum well structure made of gallium nitride (GaN). The red LED described in WO 2010/128643 includes a light emitting layer made of material obtained by adding europium (Eu) to GaN.

The red LED described in US-A-2018-0097033 has lower luminous efficacy than those of a blue LED and a green LED. As a result, the red LED requires a higher drive current, which may possibly increase power consumption. The red LED described in WO 2010/128643 has a half width of a light spectrum less than that of a blue LED and a green LED. As a result, only red color is vividly displayed, which may possibly make it difficult to satisfactorily display an image.

SUMMARY

According to an aspect, a display device includes: a substrate; a plurality of pixels provided on the substrate; and a first light emitting element and a second light emitting element that are included in each of the pixels. A light emitting layer of the first light emitting element includes gallium nitride to which europium is added, and a light emitting layer of the second light emitting element includes a multi-quantum well structure in which indium gallium nitride and gallium nitride are layered.

DETAILED DESCRIPTION

Figure 1:
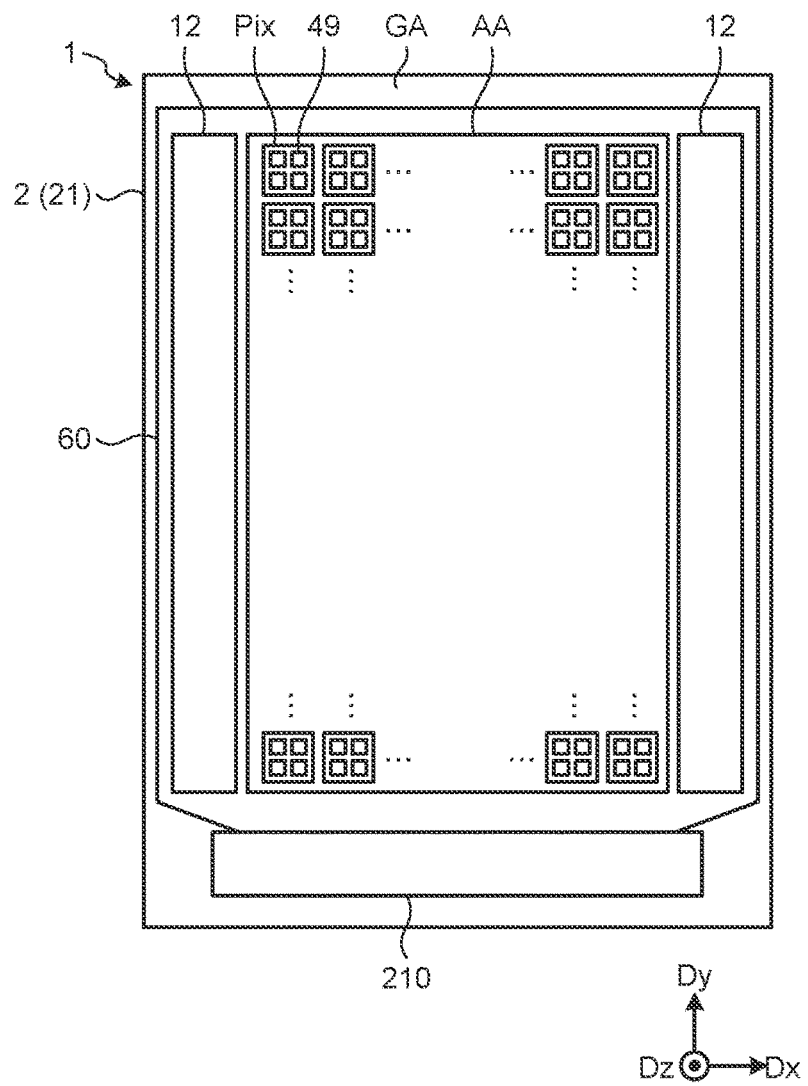
FIG. 1 is a plan view schematically illustrating a display device according to an embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

In this disclosure, when an element is described as being "on" another element, the element can be directly on the other element, or there can be one or more elements between the element and the other element.

Embodiments

FIG. 1 is a plan view schematically illustrating a display device according to an embodiment. As illustrated in FIG. 1, a display device 1 includes an array substrate 2, pixels Pix (pixel group), drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals received from the drive IC 210. The drive circuits 12 sequentially or simultaneously select a plurality of gate lines and supply gate drive signals (e.g., pixel control signals SG) to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as a chip on glass (COG) driver. The mounting form is not limited thereto, and the drive IC 210 may be mounted on a wiring substrate coupled to the peripheral region GA of the substrate 21 as a chip on film (COF) driver. The wiring substrate is a flexible printed circuit board or a rigid substrate, for example.

The cathode wiring 60 is provided in the peripheral region GA of the substrate 21. The cathode wiring 60 is provided surrounding the pixels Pix in the display region AA and the drive circuits 12 in the peripheral region GA. In other words, the cathode wiring 60 is disposed between a peripheral circuit provided on a substrate 10 and the outer periphery of the substrate 21. Cathodes (cathode terminals 22*t* (refer to FIG. 5)) of a plurality of light emitting elements 3 are coupled to the cathode wiring 60 that is common among the cathodes and are supplied with a fixed potential (e.g., a ground potential). More specifically, the cathode terminal 22*t* (refer to FIG. 5) of the light emitting element 3 is coupled to the cathode wiring 60 via a cathode electrode 22. The cathode wiring 60 is not limited to a single wiring line continuously extending along three sides of the substrate 10. The cathode wiring 60 may be composed of two partial wiring lines having a slit at any one side on the substrate 21 and simply needs to be disposed along at least one side of the substrate 21.

Figure 2:
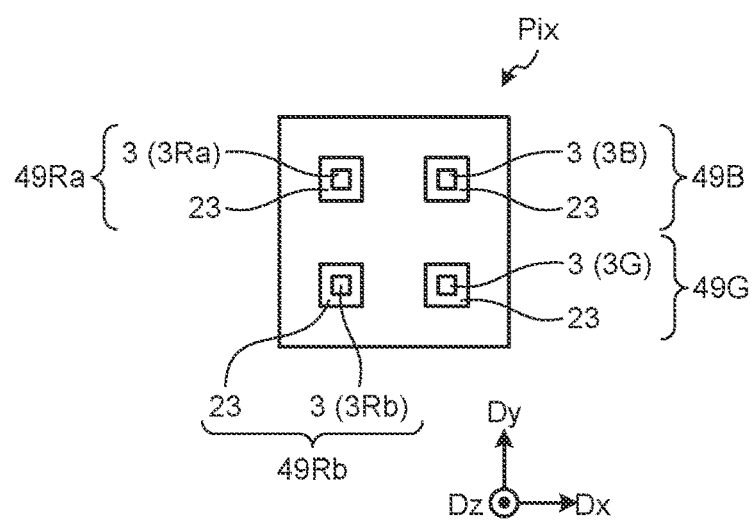
FIG. 2 is a plan view of a plurality of pixels.

FIG. 2 is a plan view of a plurality of pixels. As illustrated in FIG. 2, one pixel Pix includes a plurality of pixels 49. The pixel Pix includes a first pixel 49Ra, a second pixel 49Rb, a third pixel 49G, and a fourth pixel 49B, for example. The first pixel 49Ra displays a primary color of first red as the first color. The second pixel 49Rb displays a primary color of second red as the first color. The third pixel 49G displays a primary color of green as the second color. The fourth pixel 49B displays a primary color of blue as the third color. While both the first red and the second red are red light, they are different in the emission intensity and the half width of a light spectrum.

As illustrated in FIG. 2, the first pixel 49Ra and the second pixel 49Rb are disposed in the second direction Dy in one pixel Pix. The first pixel 49Ra and the fourth pixel 49B are disposed in the first direction Dx. The second pixel 49Rb and the third pixel 49G are disposed in the first direction Dx. The third pixel 49G and the fourth pixel 49B are disposed in the second direction Dy. The first color, the second color, and the third color are not limited to red, green, and blue, respectively, and may be any desired colors, such as complementary colors. In the following description, the first pixel 49Ra, the second pixel 49Rb, the third pixel 49G, and the fourth pixel 49B are referred to as pixels 49 when they need not be distinguished from one another.

The pixels 49 each include the light emitting element 3 and an anode electrode 23. Specifically, the first pixel 49Ra, the second pixel 49Rb, the third pixel 49G, and the fourth pixel 49B include a first light emitting element 3Ra, a second light emitting element 3Rb, a third light emitting element 3G, and a fourth light emitting element 3B, respectively. In other words, the first light emitting element 3Ra and the second light emitting element 3Rb are disposed in the second direction Dy. The first light emitting element 3Ra and the fourth light emitting element 3B are disposed in the first direction Dx. The second light emitting element 3Rb and the third light emitting element 3G are disposed in the first direction Dx. The third light emitting element 3G and the fourth light emitting element 3B are disposed in the second direction Dy. The first light emitting element 3Ra outputs first red light. The second light emitting element 3Rb outputs second red light. The third light emitting element 3G outputs green light. The fourth light emitting element 3B outputs blue light. In the following description, the first light emitting element 3Ra, the second light emitting element 3Rb, the third light emitting element 3G, and the fourth light emitting element 3B are referred to as the light emitting elements 3 when they need not be distinguished from one another.

The light emitting element 3 is an inorganic light emitting diode (LED) chip having a size of approximately 3 μm to 300 μm in planar view and is called a micro LED or a mini LED. The display device 1 including the micro LEDs in the respective pixels is also called a micro LED display device. The term "micro" of the micro LED is not intended to limit the size of the light emitting element 3.

The light emitting elements 3 may output different light in four or more colors. The first color, the second color, and the third color are not limited to red, green, and blue, respectively, and may be desired colors, such as complementary colors. The number of pixels 49 disposed in one pixel Pix is not limited to four. Five or more pixels 49 may be disposed in one pixel Pix and correspond to different colors. The array of the pixels 49 is not limited to that illustrated in FIG. 2. The first pixel 49Ra, the second pixel 49Rb, the third pixel 49G, and the fourth pixel 49B may be disposed in one of the first direction Dx and the second direction Dy.

Figure 3:
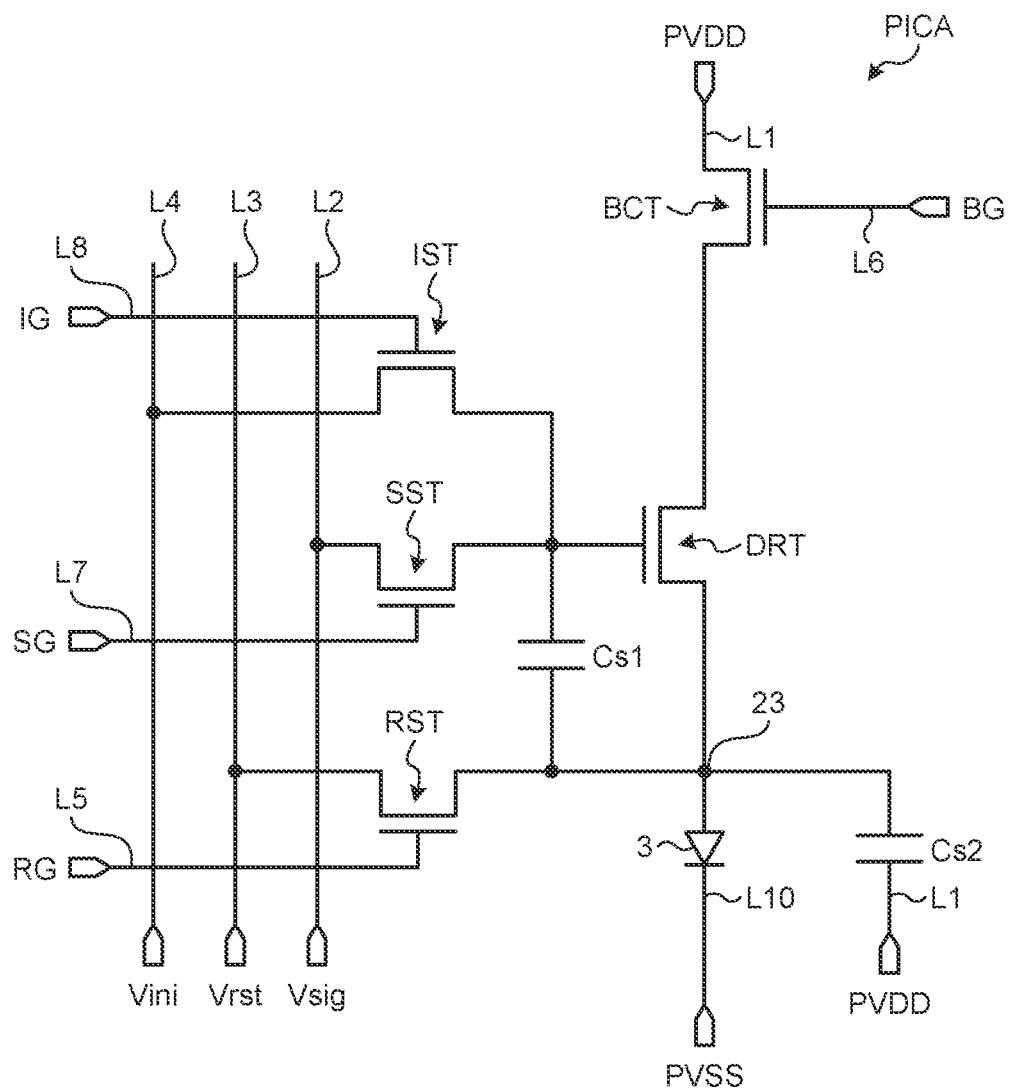
FIG. 3 is a circuit diagram of a pixel circuit.

FIG. 3 is a circuit diagram of a pixel circuit. FIG. 3 illustrates a pixel circuit PICA provided in one pixel 49. The pixel circuit PICA is provided in each of the pixels 49. As illustrated in FIG. 3, the pixel circuit PICA includes the light emitting element 3, five transistors, and two capacitances.

Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes a first capacitance Cs1 and a second capacitance Cs2.

The cathode (cathode terminal 22t) of the light emitting element 3 is coupled to a cathode power supply line L10. The anode (anode terminal 23t) of the light emitting element 3 is coupled to an anode power supply line L1 via the drive transistor DRT and the output transistor BCT. The anode power supply line L1 is supplied with an anode power supply potential PVDD. The cathode power supply line L10 is supplied with a cathode power supply potential PVSS corresponding to the cathode wiring 60 and the cathode electrode 22. The anode power supply potential PVDD is higher than the cathode power supply potential PVSS.

The anode power supply line L1 supplies, to the pixel 49, the anode power supply potential PVDD serving as a drive potential. Specifically, the light emitting element 3 ideally emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element 3 to emit light with respect to the cathode power supply potential PVSS. The anode terminal 23t of the light emitting element 3 is coupled to the anode electrode 23. The second capacitance Cs2 is coupled between the anode electrode 23 and the anode power supply line L1.

The source electrode of the drive transistor DRT is coupled to the anode terminal 23t of the light emitting element 3 via the anode electrode 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with an output control signal BG. The drain electrode of the output transistor BCT is coupled to the anode power supply line L1.

The source electrode of the initialization transistor IST is coupled to an initialization power supply line L4. The initialization power supply line L4 is supplied with an initialization potential Vini. The gate electrode of the initialization transistor IST is coupled to the initialization control signal line L8. The initialization control signal line L8 is supplied with an initialization control signal IG. In other words, the gate electrode of the drive transistor DRT is coupled to the initialization power supply line L4 via the initialization transistor IST.

The source electrode of the pixel selection transistor SST is coupled to a video signal line L2. The video signal line L2 is supplied with a video signal Vsig. The gate electrode of the pixel selection transistor SST is coupled to the pixel control signal line L7. The pixel control signal line L7 is supplied with a pixel control signal SG.

The source electrode of the reset transistor RST is coupled to a reset power supply line L3. The reset power supply line L3 is supplied with a reset power supply potential Vrst. The gate electrode of the reset transistor RST is coupled to the reset control signal line L5. The reset control signal line L5 is supplied with a reset control signal RG. The drain electrode of the reset transistor RST is coupled to the anode electrode 23 (anode terminal 23t of the light emitting element 3) and the source electrode of the drive transistor DRT. A reset operation performed by the reset transistor RST resets the voltage held in the first capacitance Cs1 and the second capacitance Cs2.

The first capacitance Cs1 is provided between the drain electrode of the reset transistor RST and the gate electrode of the drive transistor DRT. The first capacitance Cs1 and the second capacitance Cs2 of the pixel circuit PICA can reduce fluctuations in the gate voltage that would be caused by parasitic capacitance and current leakage in the drive transistor DRT.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or gradation signal). In other words, the drive transistor DRT supplies an electric current corresponding to the video signal Vsig to the light emitting element 3 in accordance with the anode power supply potential PVDD supplied via the output transistor BCT. As described above, the anode power supply potential PVDD supplied to the anode power supply line L1 is lowered by the drive transistor DRT and the output transistor BCT. As a result, an electric potential lower than the anode power supply potential PVDD is supplied to the anode terminal 23t of the light emitting element 3.

A first electrode of the second capacitance Cs2 is supplied with the anode power supply potential PVDD via the anode power supply line L1, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is the anode power supply line L1, for example. The second electrode of the second capacitance Cs2 is the anode electrode 23 coupled to the source of the drive transistor DRT and an anode coupling electrode 24 coupled to the anode electrode 23, for example.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the pixels 49 of the selected pixel row, thereby causing the light emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

Figure 4:
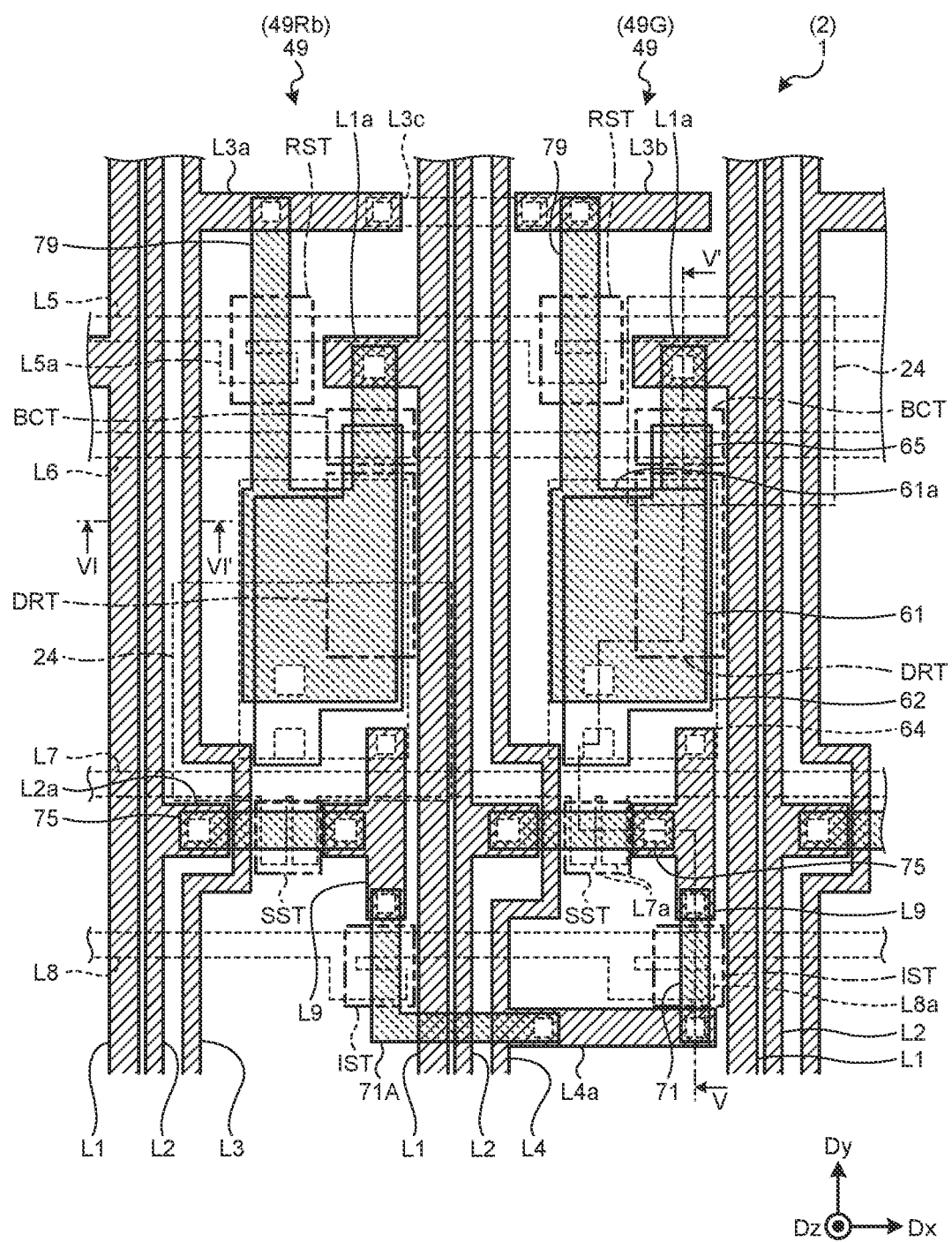
FIG. 4 is an enlarged plan view of two pixels of the display device according to the embodiment.
Figure 5:
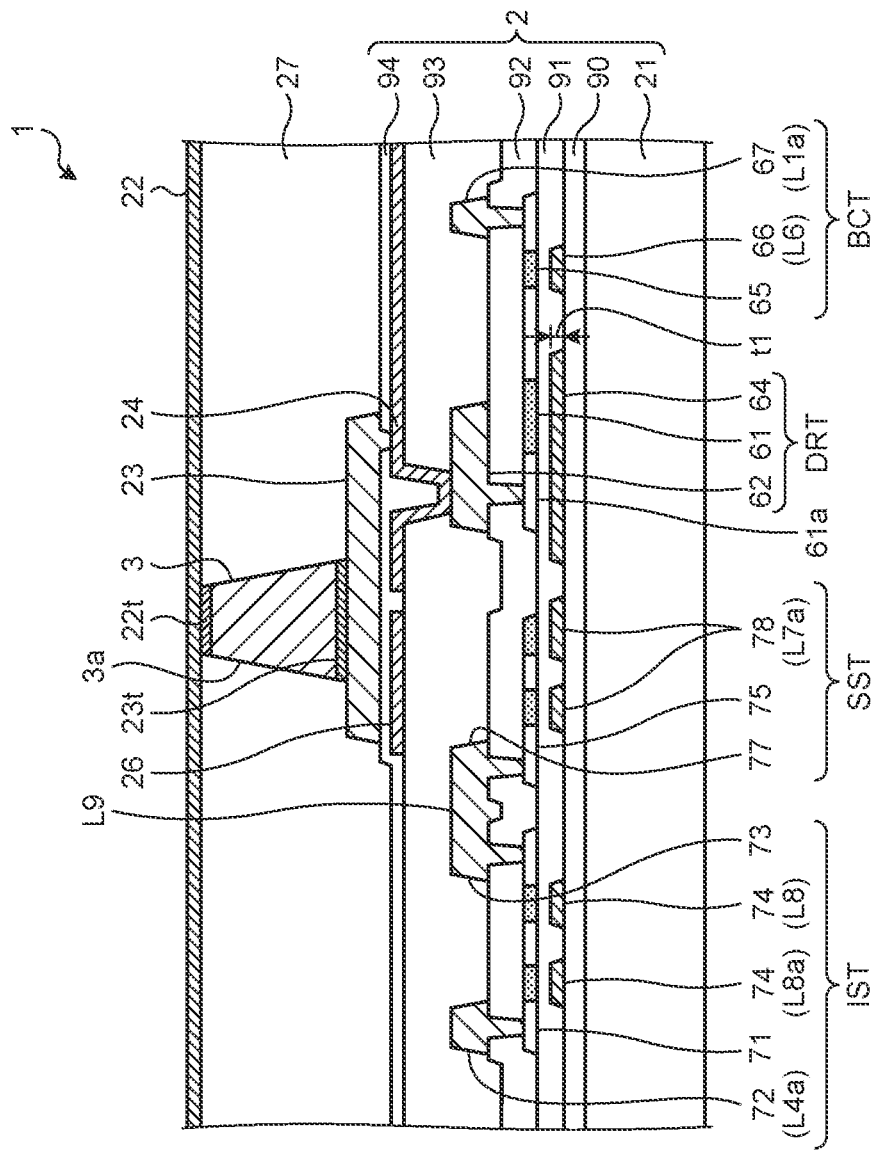
FIG. 5 is a sectional view along line V-V of FIG. 4.
Figure 6:
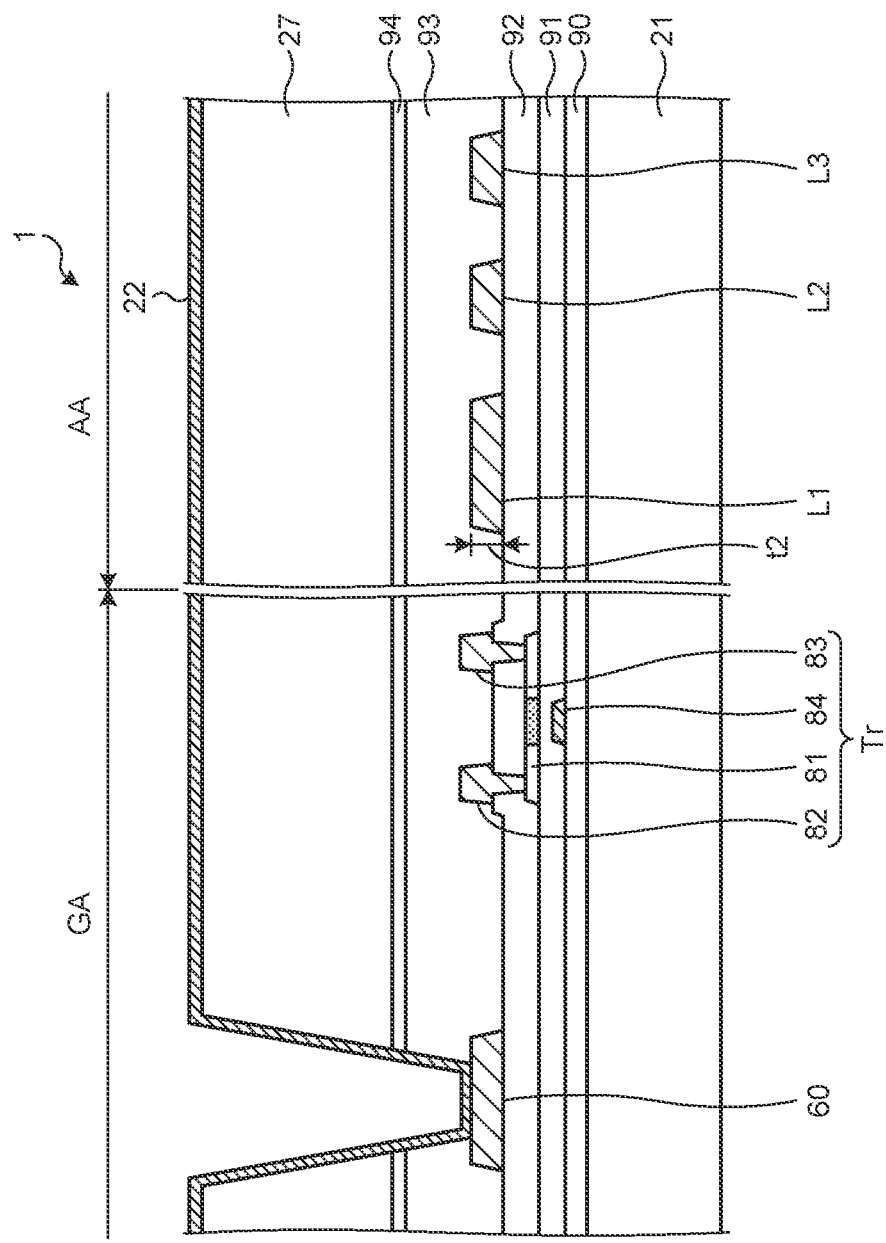
FIG. 6 is a sectional view along line VI-VI' of FIG. 4.

The following describes a specific configuration example of the transistors and the wires with reference to FIGS. 4 to 6. FIG. 4 is an enlarged plan view of two pixels of the display device according to the embodiment.

FIG. 4 illustrates two pixels 49 (e.g., the second pixel 49Rb and the third pixel 49G) that are adjacent in the first direction Dx. As illustrated in FIG. 4, the anode power supply line L1, the video signal line L2, the reset power supply line L3, and the initialization power supply line L4 extend in the second direction Dy. The reset control signal line L5, the output control signal line L6, the pixel control signal line L7, and the initialization control signal line L8 extend in the first direction Dx and intersect the anode power supply line L1, the video signal line L2, the reset power supply line L3, and the initialization power supply line L4 in planar view. Coupling wiring L9 is provided between the two anode power supply lines L1 that are adjacent in the first direction Dx. The coupling wiring L9 couples the drive transistor DRT, the pixel selection transistor SST, and the initialization transistor IST.

In order to distinguish the wiring lines and the semiconductor layers in FIG. 4, the anode power supply line L1, the video signal line L2, the reset power supply line L3, and the initialization power supply line L4 are hatched. The reset control signal line L5, the output control signal line L6, the pixel control signal line L7, and the initialization control signal line L8 are represented by dotted lines. Semiconductor layers 61, 65, 71, 75, and 79 are also hatched. The anode coupling electrode 24 is represented by a long dashed double-short dashed line.

Each of the anode power supply line L1, the video signal line L2, the reset power supply line L3, the initialization power supply line L4, and the coupling wiring L9 is made of a metal layer provided in a layer different from that of the gate lines (the reset control signal line L5, the output control signal line L6, the pixel control signal line L7, and the initialization control signal line L8).

Examples of the material of the various wires include, but are not limited to, titanium (Ti), molybdenum (Mo), tungsten (W), tantalum (Ta), niobium (Nb), indium tin oxide (ITO), aluminum (Al), silver (Ag), Ag alloy, copper (Cu), carbon nanotube, graphite, graphene, carbon nanobud, etc. The sheet resistance of the anode power supply line L1, the video signal line L2, the reset power supply line L3, the initialization power supply line L4, and the coupling wiring L9 is equal to or lower than those of the gate lines. The sheet resistance of the anode power supply line L1 is equal to or lower than those of the signal lines (the video signal line L2, the reset power supply line L3, and the initialization power supply line L4) and the coupling wiring L9. The sheet resistance of the anode power supply line L1 is 30 mΩ/square to 120 mΩ/square, for example. The sheet resistance of each of the signal lines and the coupling wiring L9 is 120 mΩ/square to 300 mΩ/square. The sheet resistance of each gate line is 300 mΩ/square to 3000 mΩ/square. With this configuration, in the display device 1, a drive voltage applied to the anode power supply line L1 can be hampered from dropping, whereby deterioration in display quality can be hampered.

Each of the various kinds of wiring lines is not limited to a single layer and may be a multilayered film. The power supply lines and the signal lines, for example, may have a multilayered structure made of Ti/Al/Ti or Mo/Al/Mo or be a single-layered film made of Al. Ti, Al, and Mo may be alloys.

The semiconductor layers 61, 65, 71, 75, and 79 are made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (ZnO), ITZO, etc. IGZO is indium gallium zinc oxide, and ITZO is indium tin zinc oxide. The semiconductor layers 61, 65, 71, 75, and 79 may be made of the same material, such as polycrystalline silicon.

As illustrated in FIG. 4, the reset power supply line L3 and the initialization power supply line L4 are shared by the two pixels 49 that are adjacent in the first direction Dx. Specifically, the second pixel 49Rb illustrated on the left in FIG. 4 is provided not with the initialization power supply line L4 but with the reset power supply line L3 extending along the video signal line L2. The third pixel 49G illustrated on the right in FIG. 4 is provided not with the reset power supply line L3 but with the initialization power supply line L4 extending along the video signal line L2. This configuration requires a smaller number of wiring lines and enables efficiently disposing the wiring lines as compared with the configuration in which the reset power supply line L3 and the initialization power supply line L4 are provided for each of the pixels 49.

The drive transistor DRT includes the semiconductor layer 61, a source electrode 62, and a gate electrode 64. The semiconductor layer 61, the source electrode 62, and the gate electrode 64 partially overlap in planar view and are provided in a region surrounded by the two anode power supply lines L1 adjacent in the first direction Dx, the output control signal line L6, and the pixel control signal line L7. A channel region is formed in part of a region in the semiconductor layer 61 overlapping the gate electrode 64. The drive transistor DRT has a single-gate structure in which one gate electrode 64 is provided overlapping the semiconductor layer 61.

The semiconductor layer 61 includes a first partial semiconductor layer 61a. The first partial semiconductor layer 61a is provided in the same layer as that of the semiconductor layer 61 and made of the same semiconductor material as that of the semiconductor layer 61. The first partial semiconductor layer 61a is a part protruding from the semiconductor layer 61 in the first direction Dx. The width of the first partial semiconductor layer 61a in the first direction Dx is greater than the width in the first direction Dx of the part of the semiconductor layer 61 coupled to the semiconductor layer 65 of the output transistor BCT. The semiconductor layer 61 is coupled to the source electrode 62 via the first partial semiconductor layer 61a. The semiconductor layer 61 and the first partial semiconductor layer 61a overlap a first insulating film 91 (refer to FIG. 5) and the gate electrode 64. The first capacitance Cs1 is formed between the first partial semiconductor layer 61a and the gate electrode 64. The semiconductor layer 61 and the first partial semiconductor layer 61a may each have a rectangular shape and be electrically coupled to each other via a coupler.

The output transistor BCT includes the semiconductor layer 65. The semiconductor layer 65 is coupled to the semiconductor layer 61 of the drive transistor DRT and intersects the output control signal line L6 in planar view. A channel region is formed in a region in the semiconductor layer 65 overlapping the output control signal line L6. The part of the output control signal line L6 overlapping the semiconductor layer 65 functions as a gate electrode 66 of the output transistor BCT. One end of the semiconductor layer 65 is electrically coupled to an anode power supply line coupling part L1a. The anode power supply line coupling part L1a is a part branched off in the first direction Dx from the anode power supply line L1. With this configuration, the drive transistor DRT and the output transistor BCT are supplied with the anode power supply potential PVDD from the anode power supply line L1.

In the third pixel 49G illustrated on the right in FIG. 4, the initialization transistor IST includes the semiconductor layer 71. In the second pixel 49Rb illustrated on the left in FIG. 4, the initialization transistor IST includes a semiconductor layer 71A. The semiconductor layers 71 and 71A intersect the initialization control signal line L8 and a branch signal line L8a in planar view. A channel region is formed in a region in the semiconductor layers 71 and 71A overlapping the initialization control signal line L8 and the branch signal line L8a. The branch signal line L8a is branched off from the initialization control signal line L8 and extends in the first direction Dx. The parts of the initialization control signal line L8 and the branch signal line L8a overlapping the semiconductor layers 71 and 71A each function as a gate electrode 74 of the initialization transistor IST. In other words, the initialization transistor IST has a double-gate structure in which two gate electrodes 74 are provided overlapping the respective semiconductor layers 71 and 71A.

In the third pixel 49G illustrated on the right in FIG. 4, the semiconductor layer 71 extends in the second direction Dy. One end of the semiconductor layer 71 is electrically coupled to the coupling wiring L9, and the other end is coupled to an initialization power supply line coupling part L4a. The initialization power supply line coupling part L4a is a part branched off from the initialization power supply line L4 in the first direction Dx. In the second pixel 49Rb illustrated on the left in FIG. 4, the semiconductor layer 71A includes a part extending in the second direction Dy and a part extending in the first direction Dx. One end of the part of the semiconductor layer 71A extending in the second direction Dy is electrically coupled to the coupling wiring L9. The part of the semiconductor layer 71A extending in the first direction Dx intersects the anode power supply line L1 and the video signal line L2 in planar view, extends to the third pixel 49G, and is electrically coupled to the initialization power supply line coupling part L4a. With this configuration, one initialization power supply line L4 is electrically coupled to the two initialization transistors IST and shared by the two pixels 49 disposed adjacent in the first direction Dx.

The pixel selection transistor SST includes the semiconductor layer 75. The semiconductor layer 75 extends in the first direction Dx and intersects two branch signal lines L7a in planar view. A channel region is formed in a region in the semiconductor layer 75 overlapping the two branch signal lines L7a. The two branch signal lines L7a are parts branched off from the pixel control signal line L7 in the second direction Dy. The parts of the two branch signal lines L7a overlapping the semiconductor layer 75 each function as a gate electrode 78 of the pixel selection transistor SST. In other words, the pixel selection transistor SST has a double-gate structure in which two gate electrodes 78 are provided overlapping the semiconductor layer 75. One end of the semiconductor layer 75 is coupled to a video signal line coupling part L2a, and the other end is coupled to the coupling wiring L9. The video signal line coupling part L2a is a part branched off from the video signal line L2 in the first direction Dx.

The reset transistor RST includes the semiconductor layer 79. The semiconductor layer 79 extends in the second direction Dy and intersects the reset control signal line L5 and a branch signal line L5a in planar view. A channel region is formed in a region in the semiconductor layer 79 overlapping the reset control signal line L5 and the branch signal line L5a. The branch signal line L5a is branched off from the reset control signal line L5 and extends in the first direction Dx. The parts of the reset control signal line L5 and the branch signal line L5a overlapping the semiconductor layer 79 each function as a gate electrode of the reset transistor RST. In other words, the reset transistor RST has a double-gate structure.

The reset power supply line L3 is coupled to reset power supply line coupling parts L3a and L3b and a bridge L3c extending in the first direction Dx. The reset power supply line coupling parts L3a and L3b are made of the same metal layer as that of the reset power supply line L3. The bridge L3c is made of a layer different from that of the reset power supply line coupling parts L3a and L3b, such as the same metal layer as that of the various gate lines. The reset power supply line coupling part L3a is provided in the second pixel 49Rb, and the reset power supply line coupling part L3b is provided in the third pixel 49G. The anode power supply line L1, the video signal line L2, and the initialization power supply line L4 are provided between the reset power supply line coupling parts L3a and L3b. The bridge L3c intersects the anode power supply line L1, the video signal line L2, and the initialization power supply line L4 in planar view and couples the reset power supply line coupling parts L3a and L3b.

In the second pixel 49Rb, one end of the semiconductor layer 79 is coupled to the reset power supply line coupling part L3a. In the third pixel 49G, one end of the semiconductor layer 79 is coupled to the reset power supply line coupling part L3b. The other ends of the semiconductor layers 79 are each electrically coupled to the semiconductor layer 61 of the drive transistor DRT. In other words, the other end of the semiconductor layer 79 of the reset transistor RST is electrically coupled to the anode terminal 23t of the light emitting element 3 via the semiconductor layer 61 and the source electrode 62. With the configuration described above, one reset power supply line L3 is electrically coupled to two reset transistors RST and shared by two pixels 49 disposed adjacent in the first direction Dx.

The first capacitance Cs1 (refer to FIG. 3) is formed between the semiconductor layer 61 (first partial semiconductor layer 61a) and the gate electrode 64. The anode coupling electrode 24 is electrically coupled to the drive transistor DRT and disposed overlapping at least the anode power supply line L1. The second capacitance Cs2 (refer to FIG. 3) is formed between the anode coupling electrode 24 and the group of the anode power supply line L1 and the various wires coupled to the anode power supply line L1. The second capacitance Cs2 formed in the second pixel 49Rb and the second capacitance Cs2 formed in the third pixel 49G are substantially equal in magnitude and are approximately 250 fF, for example.

The drive transistor DRT and the output transistor BCT that supply the drive current to the light emitting element 3 according to the present embodiment has a single-gate structure. The initialization transistor IST, the pixel selection transistor SST, and the reset transistor RST have a double-gate structure. This configuration can reduce current leakage in the initialization transistor IST, the pixel selection transistor SST, and the reset transistor RST.

The following describes a sectional configuration of the display device 1. FIG. 5 is a sectional view along line V-V' of FIG. 4. FIG. 6 is a sectional view along line VI-VI' of FIG. 4. FIG. 6 schematically illustrates the cathode wiring 60 and a transistor Tr provided in the peripheral region GA.

As illustrated in FIG. 5, the light emitting element 3 is provided on the array substrate 2. The array substrate 2 includes the substrate 21, various transistors, various kinds of wiring, and various insulating films. The substrate 21 is an insulating substrate, such as a glass substrate, a resin substrate, or a resin film.

In the present specification, a direction from the substrate 21 to a flattening film 27 in a direction perpendicular to the surface of the substrate 21 is referred to as an "upper side". A direction from the flattening film 27 to the substrate 21 is referred to as a "lower side".

The drive transistor DRT, the output transistor BCT, the initialization transistor IST, the pixel selection transistor SST, and the reset transistor RST are provided on a first surface of the substrate 21. Various layers are stacked on the first surface of the substrate 21 in order of an undercoat film 90, the gate lines, the first insulating film 91, the semiconductor layers 61, 65, 71, and 75, a second insulating film 92, the signal lines and the power supply lines, a third insulating film 93, the anode coupling electrode 24 and a shield electrode 26, and a fourth insulating film 94.

The anode electrode 23 and the light emitting element 3 are provided on the anode coupling electrode 24 and the shield electrode 26 with a fourth insulating film 94 interposed therebetween.

In the display device 1, the array substrate 2 includes the layers from the substrate 21 to the anode electrode 23. The array substrate 2 does not include the flattening film 27, the cathode electrode 22, or the light emitting element 3.

The undercoat film 90, the first insulating film 91, the second insulating film 92, and the fourth insulating film 94 are made of inorganic insulating material, such as a silicon oxide film (SiO), a silicon nitride film (SiN), and a silicon oxynitride film (SiON). Each inorganic insulating film is not limited to a single layer and may be a multilayered film. The undercoat film 90 is not necessarily provided. The third insulating film 93 and the flattening film 27 are organic insulating films or inorganic-organic hybrid insulating films (made of material in which an organic group (a methyl group or a phenyl group) is bonded to a main chain of Si—O, for example).

The gate electrodes 64, 66, 74, and 78 are provided on the substrate 21 with the undercoat film 90 interposed therebetween. The first insulating film 91 is provided on the undercoat film 90 to cover the gate electrodes 64, 66, 74, and 78. The semiconductor layers 61, 65, 71, and 75 are provided on the first insulating film 91. The second insulating film 92 is provided on the first insulating film 91 to cover the semiconductor layers 61, 65, 71, and 75.

In the example illustrated in FIG. 5, the transistors have what is called a bottom-gate structure. The transistors may have a top-gate structure in which the gate electrode is provided on the semiconductor layer. Alternatively, the transistors may have a dual-gate structure in which the gate electrodes are provided both on and under the semiconductor layer.

The coupling wiring L9, the source electrodes 62 and 72, and a drain electrode 67 are provided on the second insulating film 92. The source electrode 62 is electrically coupled to the first partial semiconductor layer 61a (semiconductor layer 61) through a contact hole formed in the second insulating film 92.

The drain electrode 67 is electrically coupled to the semiconductor layer 65 through a contact hole formed in the second insulating film 92. The source electrode 72 of the initialization transistor IST is electrically coupled to the semiconductor layer 71 through a contact hole formed in the second insulating film 92.

One end of the coupling wiring L9 is electrically coupled to the semiconductor layer 75 of the pixel selection transistor SST through a contact hole formed in the second insulating film 92. The part of the coupling wiring L9 overlapping the semiconductor layer 75 functions as a drain electrode 77. The other end of the coupling wiring L9 is electrically coupled to the semiconductor layer 71 of the initialization transistor IST through a contact hole formed in the second insulating film 92. The part of the coupling wiring L9 overlapping the semiconductor layer 71 functions as a drain electrode 73. With this configuration, the drain of the pixel selection transistor SST and the drain of the initialization transistor IST are electrically coupled via the coupling wiring L9.

The third insulating film 93 is provided on the second insulating film 92 to cover the source electrodes 62 and 72 and the drain electrodes 67, 73, and 77. The anode coupling electrode 24 and the shield electrode 26 are provided on the third insulating film 93. The anode coupling electrode 24 is coupled to the source electrode 62 through a contact hole formed in the third insulating film 93. The shield electrode 26 is provided under the anode electrode 23 and the light emitting element 3.

The fourth insulating film 94 is provided on the third insulating film 93 to cover the anode coupling electrode 24 and the shield electrode 26. The anode electrode 23 is provided on the fourth insulating film 94. The anode electrode 23 is electrically coupled to the anode coupling electrode 24 through a contact hole formed in the fourth insulating film 94.

The light emitting element 3 is provided on the anode electrode 23, and the anode terminal 23t of the light emitting element 3 is coupled to the anode electrode 23. As a result, the anode terminal 23t of the light emitting element 3 is electrically coupled to the source electrode 62 of the drive transistor DRT.

The flattening film 27 is provided on the fourth insulating film 94 to cover at least side surfaces 3a of the light emitting element 3. The cathode electrode 22 is provided on the flattening film 27 and coupled to the cathode terminal 22t of the light emitting element 3. The cathode electrode 22 is provided from the display region AA to the peripheral region GA and electrically coupled to the light emitting elements 3 of a plurality of pixels 49.

As illustrated in FIG. 6, the peripheral region GA of the substrate 21 is provided with the transistors serving as a plurality of transistors Tr included in the drive circuits 12 (refer to FIG. 1) and the cathode wiring 60. The cathode wiring 60 is provided in the same layer as that of the anode power supply line L1 and provided on the second insulating film 92 in the peripheral region GA. The cathode electrode 22 illustrated in FIG. 5 is electrically coupled to the cathode wiring 60 through a contact hole formed in the third insulating film 93, the fourth insulating film 94, and the flattening film 27. The cathode power supply line L10 illustrated in FIG. 3 includes the cathode wiring 60 and the cathode electrode 22.

The transistor Tr includes a semiconductor layer 81, a source electrode 82, a drain electrode 83, and a gate electrode 84. Detailed explanation of the transistor Tr is omitted herein because it has the same layer configuration as that of the transistors included in the pixel circuit PICA. The semiconductor layer 81 is provided on the second insulating film 92, that is, in the same layer as that of the semiconductor layers 61, 65, 71, 75, and 79. The transistor Tr may be provided in a layer different from that of the transistors of the pixel 49.

As illustrated in FIG. 6, the anode power supply line L1, the video signal line L2, and the reset power supply line L3 are provided on the second insulating film 92. The width of the anode power supply line L1 is greater than those of the video signal line L2 and the reset power supply line L3. The thickness t2 of the anode power supply line L1 is greater than the thickness t1 (refer to FIG. 5) of the gate electrode 64. The thickness t2 of the anode power supply line L1 is equal to the thickness of the video signal line L2 and the reset power supply line L3. This configuration can reduce the resistance of the anode power supply line L1. The thickness t2 of the anode power supply line L1 may be different from the thickness of the video signal line L2 and the reset power supply line L3.

The layer configuration of the wiring can be appropriately modified. The anode power supply line L1 may be provided in a layer different from that of the signal lines, such as the video signal line L2, and the reset power supply line L3.

The capacitance formed between the anode power supply line L1 and the various gate lines is used as a decoupling capacitor. The decoupling capacitor can accommodate fluctuations in the anode power supply potential PVDD and enable the drive IC 210 to stably operate. In addition, the decoupling capacitor can hamper electromagnetic noise generated in the display device 1 from leaking outside.

The configuration of the pixel circuit PICA illustrated in FIG. 3 can be appropriately modified. The number of wiring lines and the number of transistors in one pixel 49 may be different from those illustrated in FIG. 3, for example.

Figure 7:
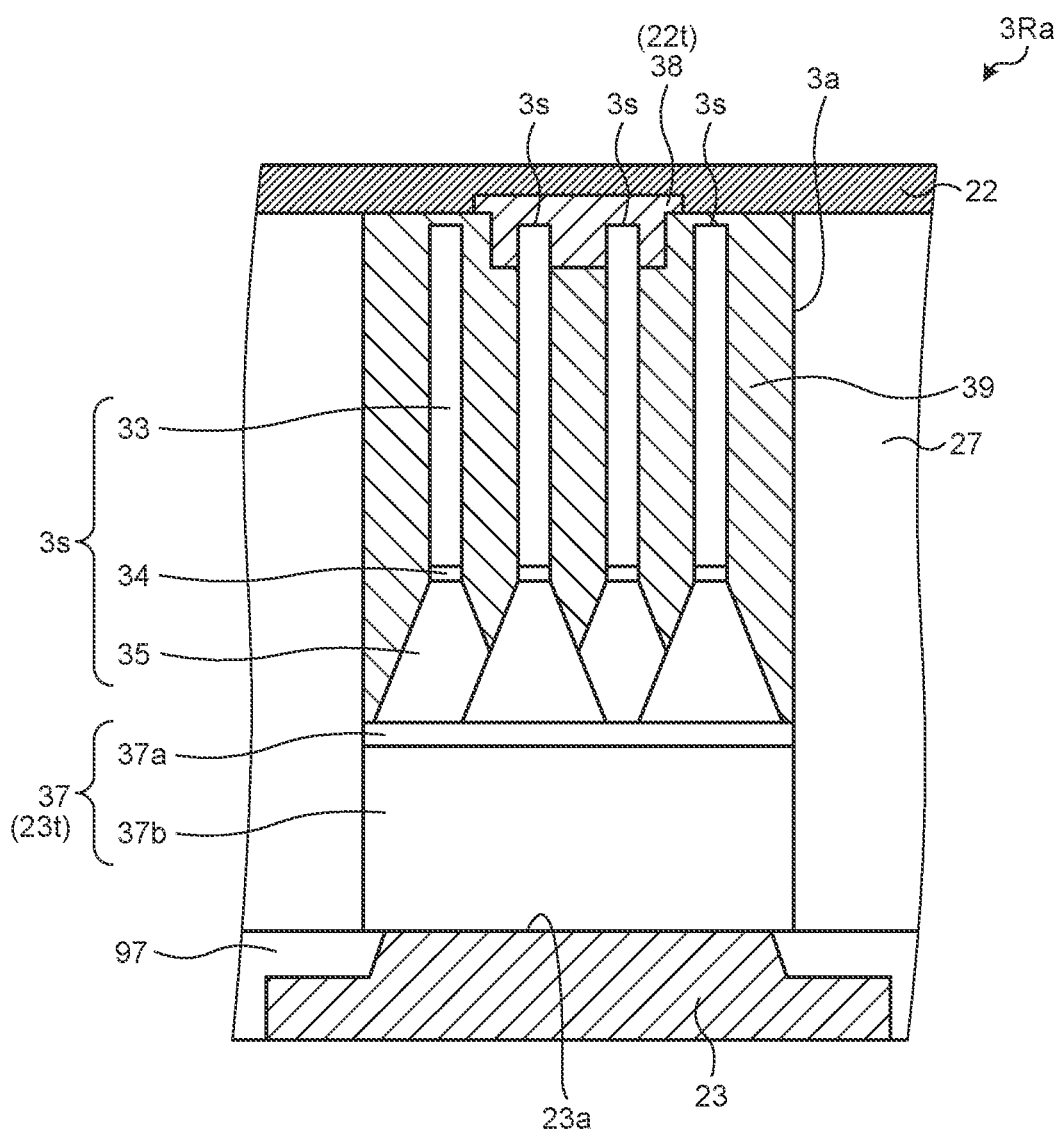
FIG. 7 is a sectional view of a first light emitting element according to the embodiment.

FIG. 7 is a sectional view of the first light emitting element according to the embodiment. In the display device 1 according to the present embodiment, the first light emitting element 3Ra has what is called a face-up structure in which the anode terminal 23t is provided at the lower part and the cathode terminal 22t is provided at the upper part.

As illustrated in FIG. 7, the first light emitting element 3Ra includes a plurality of partial light emitting elements 3s, a protective layer 39, a p-type electrode 37, and an n-type electrode 38. The protective layer 39 covers the partial light emitting elements 3s. The partial light emitting elements 3s have a columnar shape and are provided between the p-type electrode 37 and the n-type electrode 38. The partial light emitting elements 3s each include an n-type cladding layer 33, a light emitting layer 34, and a p-type cladding layer 35. The n-type electrode 38 is electrically coupled to the n-type cladding layer 33. The p-type electrode 37 is electrically coupled to the p-type cladding layer 35. The p-type cladding layer 35, the light emitting layer 34, and the n-type cladding layer 33 are stacked on the p-type electrode 37 in the order as listed. The n-type cladding layer 33 and the p-type cladding layer 35 are made of a compound semiconductor, such as gallium nitride (GaN) and aluminum indium phosphorus (AlInP). The light emitting layer 34 of the first light emitting element 3Ra is made of GaN to which europium (Eu) is added.

The n-type electrode 38 is made of translucent conductive material, such as ITO. The n-type electrode 38 serves as the cathode terminal 22t of the first light emitting element 3Ra and is coupled to the cathode electrode 22. The p-type electrode 37 serves as the anode terminal 23t of the first light emitting element 3Ra and includes a Pt layer 37a and a thick Au layer 37b produced by plating. The thick Au layer 37b is coupled to a placement surface 23a of the anode electrode 23.

The protective layer 39 is a spin on glass (SOG) layer, for example. The side surfaces of the protective layer 39 correspond to the side surfaces 3a of the first light emitting element 3Ra. The flattening film 27 is provided surrounding the side surfaces of the protective layer 39.

Figure 8:
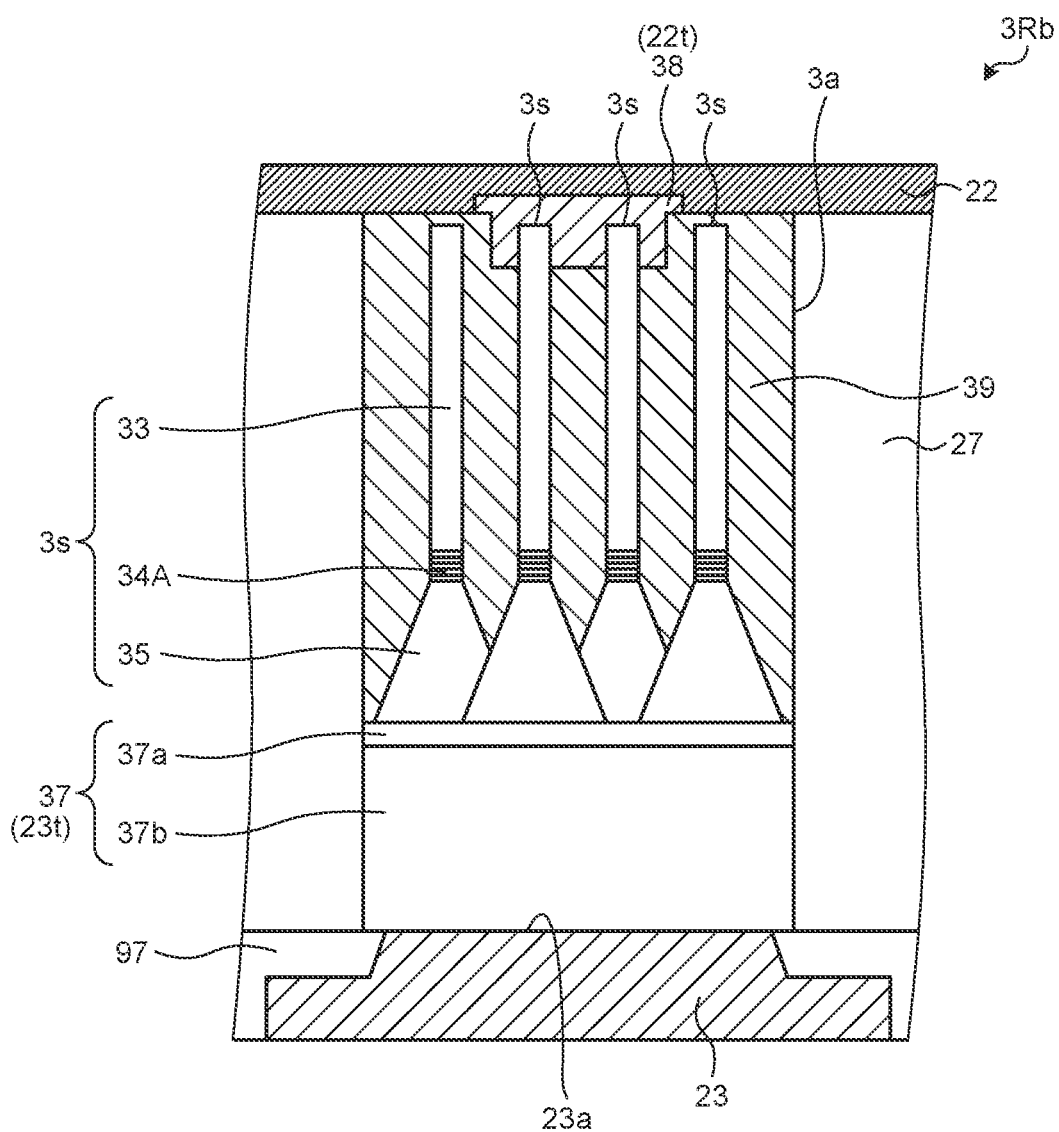
FIG. 8 is a sectional view of a second light emitting element according to the embodiment.

FIG. 8 is a sectional view of the second light emitting element according to the embodiment. The second light emitting element 3Rb that outputs second red light has a structure different from that of the first light emitting element 3Ra that outputs first red light. Specifically, as illustrated in FIG. 8, a light emitting layer 34A of the second light emitting element 3Rb includes a multi-quantum well structure in which indium gallium nitride (InGaN) and gallium nitride (GaN) are multiply layered. The third light emitting element 3G and the fourth light emitting element 3B have the same multilayered structure as that of the first light emitting element 3Ra or the second light emitting element 3Rb. The third light emitting element 3G and the fourth light emitting element 3B may include a single-layered light emitting layer 34 like the first light emitting element 3Ra or a multilayered light emitting layer 34 like the second light emitting element 3Rb.

Figure 9:
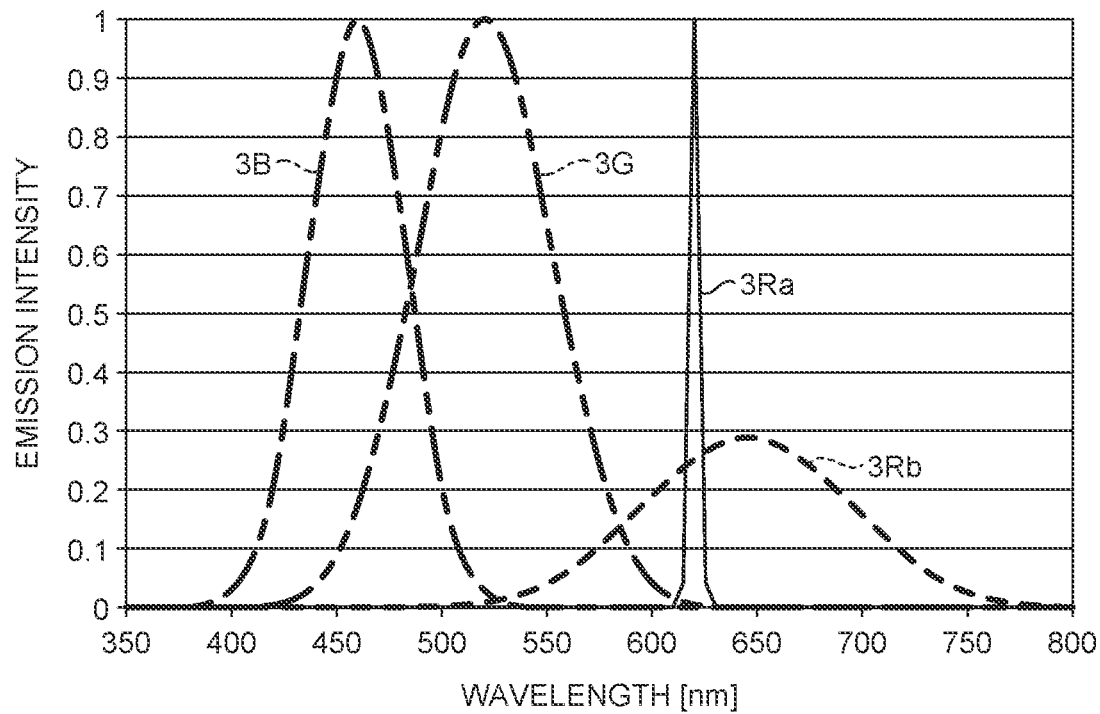
FIG. 9 is a graph schematically illustrating the relation between the emission intensity and the wavelength of each of the light emitting elements.

FIG. 9 is a graph schematically illustrating the relation between the emission intensity and the wavelength of each of the light emitting elements. The maximum emission wavelengths in the spectra of light output from the first light emitting element 3Ra, the second light emitting element 3Rb, the third light emitting element 3G, and the fourth light emitting element 3B are approximately 620 nm, 645 nm, 530 nm, and 450 nm, respectively.

The maximum emission wavelength of the first light emitting element 3Ra is near that of the second light emitting element 3Rb. Both the first light emitting element 3Ra and the second light emitting element 3Rb output red light (the first red and the second red). The wavelength region of the spectrum of the first red light overlaps that of the spectrum of the second red light. The half width of the spectrum of the first red light is less than that of the spectrum of the second red light. The emission intensity of the spectrum of the first red light is higher than that of the spectrum of the second red light. The present embodiment causes the first light emitting element 3Ra and the second light emitting element 3Rb having different light spectra to display red, thereby satisfactorily displaying an image.

Figure 10:
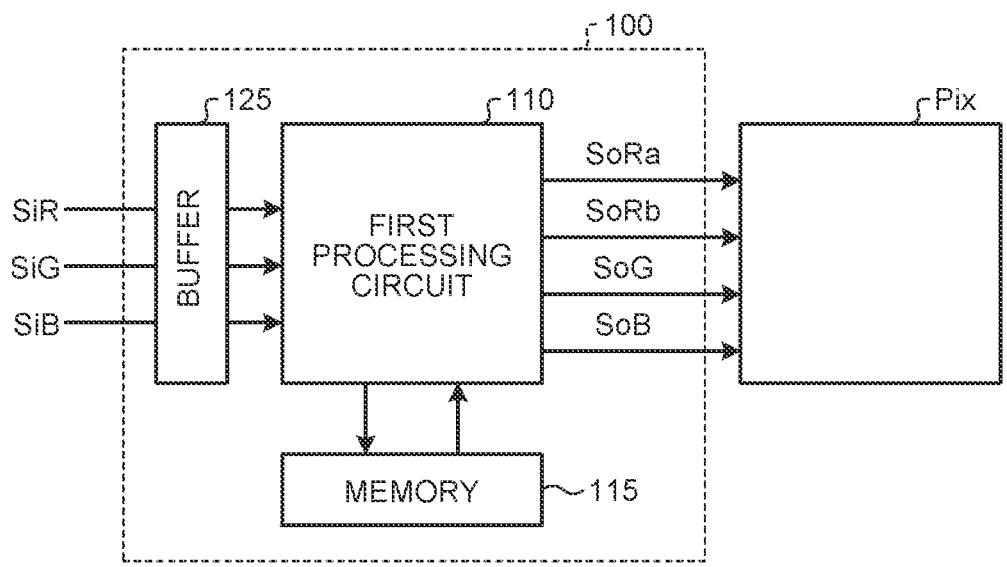
FIG. 10 is a block diagram schematically illustrating the configuration of a signal processing circuit.
Figure 11:
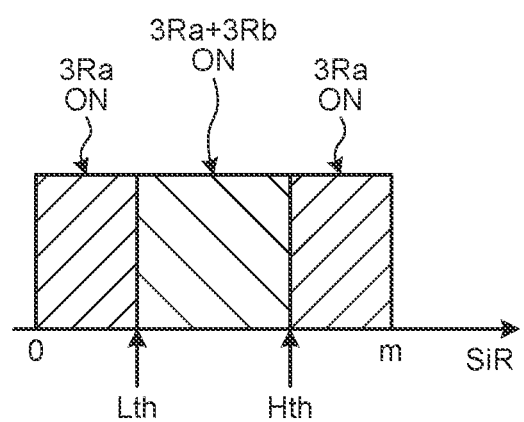
FIG. 11 is a diagram for explaining the relation between the input gradation value and the light emitting element to be driven.

The following describes a method for setting output gradation values of the light emitting elements with reference to FIGS. 10 and 11. FIG. 10 is a block diagram schematically illustrating the configuration of a signal processing circuit. FIG. 11 is a diagram for explaining the relation between the input gradation value and the light emitting element to be driven. As illustrated in FIG. 10, a signal processing circuit 100 includes a first processing circuit 110, a memory 115, and a buffer 125. The signal processing circuit 100 calculates output gradation values SoRa, SoRb, SoG, and SoB of the respective four pixels 49 based on the video signals Vsig. The video signals Vsig include input gradation values SiR, SiG, and SiB of each pixel Pix. The input gradation values SiR, SiG, and SiB are gradation values of red, green, and blue, respectively. The output gradation value SoRa is a gradation value corresponding to the first pixel 49Ra. The output gradation value SoRb is a gradation value corresponding to the second pixel 49Rb. The output gradation value SoG is a gradation value corresponding to the third pixel 49G. The output gradation value SoB is a gradation value corresponding to the fourth pixel 49B. The signal processing circuit 100 may be included in the drive IC 210 illustrated in FIG. 1 or provided on the substrate 21 as another circuit chip different from the drive IC 210, for example. In the following description, the output gradation values SoRa, SoRb, SoG, and SoB are referred to as output gradation values So when they need not be distinguished from one another. The input gradation values SiR, SiG, and SiB are referred to as input gradation values Si when they need not be distinguished from one another.

The buffer 125 is a circuit that stores therein the input gradation values Si. The buffer 125 may store therein the input gradation values Si including the input gradation values SiR, SiG, and SiB included in the video signals Vsig of one frame or acquire the input gradation values Si included in part of the video signals Vsig of one frame.

The memory 115 includes data LUT indicating information on the relation between the input gradation values SiR, SiG, and SiB and the output gradation values SoRa, SoRb, SoG, and SoB of the respective four pixels 49. The data LUT is table data, such as a look-up table.

In the data LUT, a range where the input gradation value SiR is 0 to a first threshold Lth (refer to FIG. 11) is associated with the output gradation values SoRa and SoRb for turning on only the first light emitting element 3Ra. In other words, in the range where the input gradation value SiR is 0 to the first threshold Lth, the output gradation value SoRb is 0 (gradation value of 0). In the data LUT, a range where the input gradation value SiR is larger than the first threshold Lth and smaller than a second threshold Hth (refer to FIG. 11) is associated with the output gradation values SoRa and SoRb for turning on both the first light emitting element 3Ra and the second light emitting element 3Rb. The second threshold Hth is a gradation value larger than the first threshold Lth. In the data LUT, a range where the input gradation value SiR is equal to or larger the second threshold Hth is associated with the output gradation values SoRa and SoRb for turning on only the first light emitting element 3Ra. In other words, in the range where the input gradation value SiR is equal to or larger than the second threshold Hth, the output gradation value SoRb is 0 (gradation value of 0). The second threshold Hth is a predetermined value equal to or smaller than the maximum gradation value m (e.g., m=255) of the input gradation value SiR.

The first processing circuit 110 refers to the data LUT read from the memory 115 and identifies the output gradation values SoRa, SoRb, SoG, and SoB corresponding to the input gradation values SiR, SiG, and SiB. The first processing circuit 110 outputs the output gradation values SoRa, SoRb, SoG, and SoB to the pixel Pix. The pixels 49 are each turned on based on the output gradation values SoRa, SoRb, SoG, and SoB.

As illustrated in FIG. 11, in the range where the input gradation value SiR is 0 to the first threshold Lth, the first light emitting element 3Ra is turned on and the second light emitting element 3Rb is not turned on based on the output gradation values SoRa and SoRb. In the range where the input gradation value SiR is larger than the first threshold Lth and smaller than the second threshold Hth, both the first light emitting element 3Ra and the second light emitting element 3Rb are turned on based on the output gradation values SoRa and SoRb. In the range where the input gradation value SiR is equal to or larger than the second threshold Hth, only the first light emitting element 3Ra is turned on, and the second light emitting element 3Rb is not turned on based on the output gradation values SoRa and SoRb.

As described above, to perform low-gradation and high-gradation display in the present embodiment, only the first light emitting element 3Ra having high luminous efficacy is turned on. Consequently, an increase in the drive current can be hampered, and an image can be satisfactorily displayed. To perform intermediate-gradation display in the present embodiment, both the first light emitting element 3Ra and the second light emitting element 3Rb are turned on, thereby satisfactorily displaying an image. This mechanism can hamper an increase in the drive current supplied to the second light emitting element 3Rb. Consequently, it is possible to make the second capacitance Cs2 formed in the second pixel 49Rb approximately equal to that of the other pixels 49.

First Modification

Figure 12:
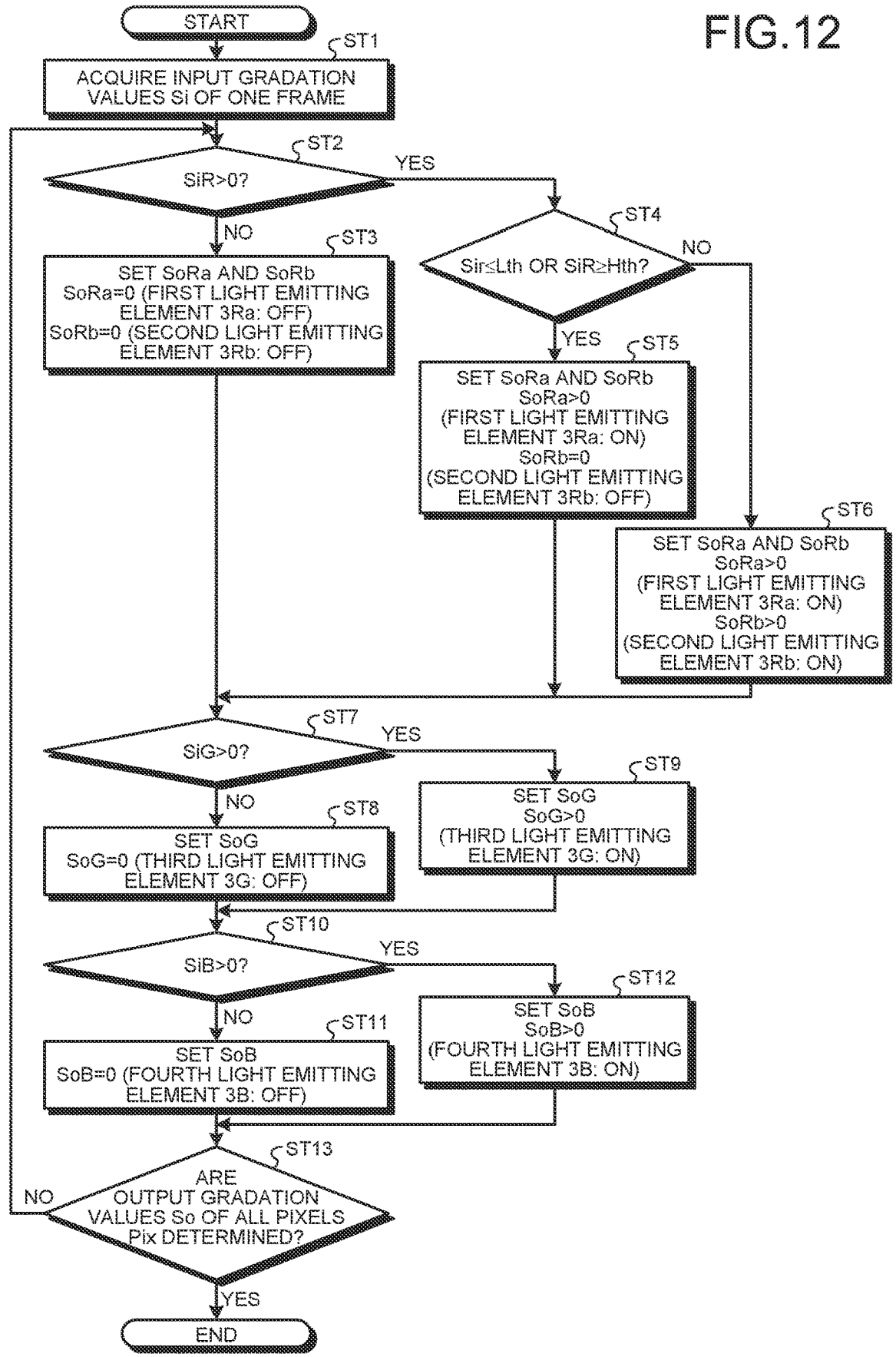
FIG. 12 is a flowchart for explaining a method for setting output gradation values of the light emitting elements according to a first modification.

FIG. 12 is a flowchart for explaining the method for setting the output gradation values of the light emitting elements. In the first embodiment, the signal processing circuit 100 calculates the output gradation values SoRa, SoRb, SoG, and SoB based on the predetermined data LUT; however, the present embodiment is not limited thereto. As illustrated in FIG. 12, the signal processing circuit 100 acquires an image of one frame (Step ST1). Specifically, the buffer 125 acquires the video signals Vsig of one frame and stores therein the input gradation values SiR, SiG, and SiB corresponding to red, green, and blue, respectively.

The first processing circuit 110 determines whether the input gradation value SiR is larger than 0 for each pixel Pix (Step ST2). In other words, the first processing circuit 110 determines whether to display red for each pixel Pix. If the input gradation value SiR is 0 (No at Step ST2), the first processing circuit 110 sets a gradation value of 0 as the output gradation values SoRa and SoRb (Step ST3). A gradation value of 0 is a gradation value for bringing the pixel Pix into an OFF state. The set output gradation values SoRa and SoRb are output to the pixel Pix, thereby bringing the first light emitting element 3Ra and the second light emitting element 3Rb into the OFF state. If the input gradation value SiR is larger than 0 (Yes at Step ST2), that is, if the input gradation value SiR is 1 or larger, the first processing circuit 110 compares the input gradation value SiR with the first threshold Lth and the second threshold Hth (Step ST4).

If the input gradation value SiR is larger than 0 and equal to or smaller than the first threshold Lth or if the input gradation value SiR is equal to or larger than the second threshold Hth (Yes at Step ST4), the first processing circuit 110 sets the output gradation values SoRa and SoRb for turning on only the first light emitting element 3Ra (Step ST5). More specifically, the first processing circuit 110 sets a value larger than 0 (gradation value SioRa) based on the input gradation value SiR as the output gradation value SoRa and sets a gradation value of 0 as the output gradation value SoRb. The set output gradation values SoRa and SoRb are output to the pixel Pix, thereby turning on the first light emitting element 3Ra and bringing the second light emitting element 3Rb into the OFF state.

If the input gradation value SiR is larger than the first threshold Lth and smaller than the second threshold Hth (No at Step ST4), the first processing circuit 110 sets the output gradation values SoRa and SoRb for turning on the first light emitting element 3Ra and the second light emitting element 3Rb (Step ST6). More specifically, the first processing circuit 110 sets a value larger than 0 (gradation value SioRa) based on the input gradation value SiR as the output gradation value SoRa and sets a gradation value SioRb based on the input gradation value SiR as the output gradation value SoRb. The gradation value SioRb is larger than 0. The set output gradation values SoRa and SoRb are output to the pixel Pix, thereby turning on the first light emitting element 3Ra and the second light emitting element 3Rb.

After the processing at Step ST3, ST5, or ST6 is completed, the first processing circuit 110 determines whether the input gradation value SiG is larger than 0 (Step ST7). In other words, the first processing circuit 110 determines whether to display green. If the input gradation value SiG is 0 (No at Step ST7), the first processing circuit 110 sets a gradation value of 0 as the output gradation value SoG (Step ST8). The set output gradation value SoG is output to the pixel Pix, thereby bringing the third light emitting element 3G into the OFF state. If the input gradation value SiG is larger than 0 (Yes at Step ST7), that is, if the input gradation value SiG is 1 or larger, the first processing circuit 110 sets a gradation value (gradation value SioG) based on the input gradation value SiG as the output gradation value SoG (Step ST9). The set output gradation value SoG is output to the pixel Pix, thereby turning on the third light emitting element 3G.

After the processing at Step ST8 or ST9 is completed, the first processing circuit 110 determines whether the input gradation value SiB is larger than 0 (Step ST10). In other words, the first processing circuit 110 determines whether to display blue. If the input gradation value SiB is 0 (No at Step ST10), the first processing circuit 110 sets a gradation value of 0 as the output gradation value SoB (Step ST11). The set output gradation value SoB is output to the pixel Pix, thereby bringing the fourth light emitting element 3B into the OFF state. If the input gradation value SiB is larger than 0 (Yes at Step ST10), that is, if the input gradation value SiB is 1 or larger, the first processing circuit 110 sets a gradation value (gradation value SioB) based on the input gradation value SiB as the output gradation value SoB (Step ST12). The set output gradation value SoB is output to the pixel Pix, thereby turning on the fourth light emitting element 3B.

After the processing at Step ST11 or ST12 is completed, the first processing circuit 110 determines whether the output gradation values SoRa, SoRb, SoG, and SoB of all the pixels Pix of one frame are set (Step ST13). If the output gradation values So of all the pixels Pix are not set (No at Step ST13), the first processing circuit 110 performs the process starting from Step ST2 on the next pixel Pix. If the output gradation values So of all the pixels Pix are set (Yes at Step ST13), the first processing circuit 110 ends the setting of the output gradation values So. After the setting is completed, the output gradation values SoRa, SoRb, SoG, and SoB are output to the pixels Pix, and the light emitting elements 3 disposed in the pixels Pix are controlled to be turned on based on the set output gradation values SoRa, SoRb, SoG, and SoB.

The set output gradation values So may be output to the pixels Pix after setting the output gradation values So of all the pixels of one frame is completed or after setting the output gradation values So of a pixel group of one line coupled to the common gate line is completed. Alternatively, the output gradation values So may be sequentially output to each pixel Pix in the order in which its output gradation values So are set.

Second Modification

Figure 13:
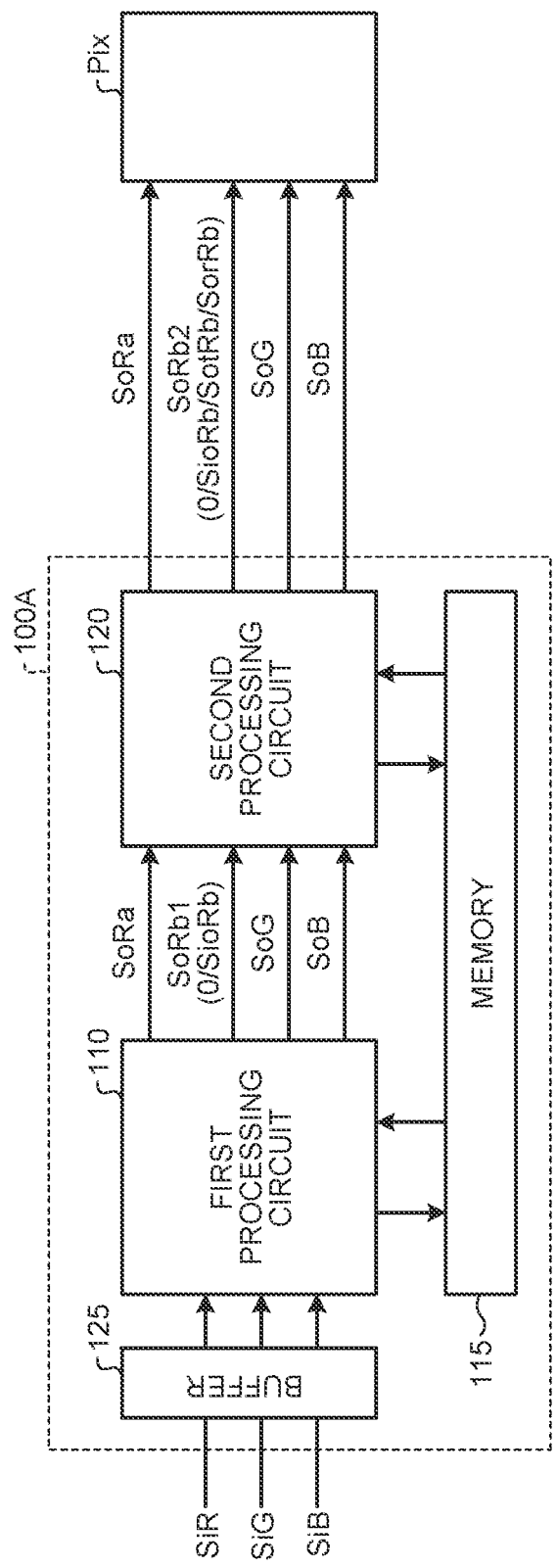
FIG. 13 is a block diagram schematically illustrating the configuration of the signal processing circuit according to a second modification.
Figure 14:
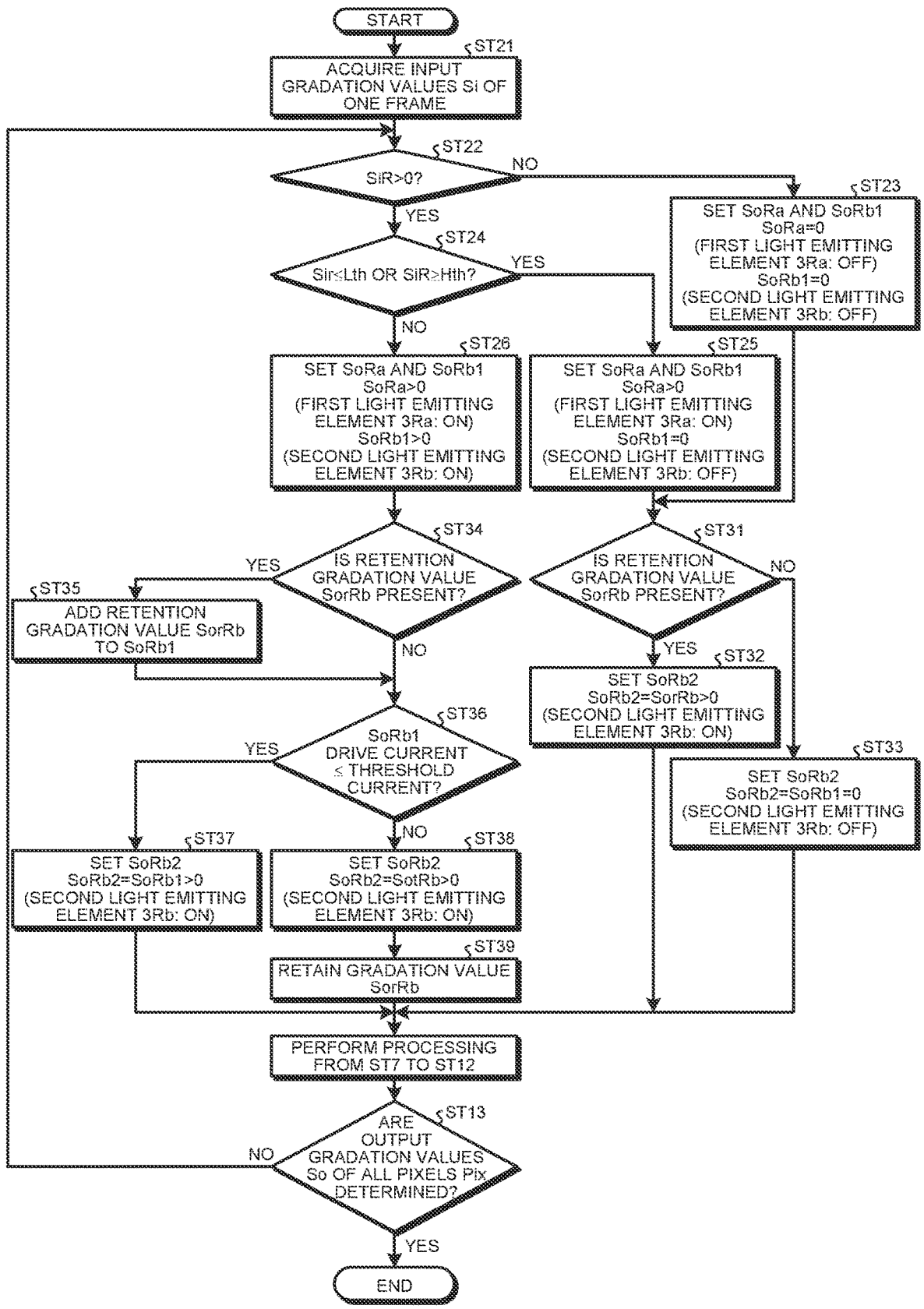
FIG. 14 is a flowchart for explaining the method for setting the output gradation values of the light emitting elements according to the second modification.

FIG. 13 is a block diagram schematically illustrating the configuration of the signal processing circuit according to a second modification. FIG. 14 is a flowchart for explaining the method for setting the output gradation values of the light emitting elements according to the second modification. As illustrated in FIG. 13, a signal processing circuit 100A further includes a second processing circuit 120. In the following description, two pixels Pix adjacent to each other are referred to as a first pixel group Pix1 and a second pixel group Pix2. The signal processing circuit 100A turns on the pixels 49 of the first pixel group Pix1 and one or some of the pixels 49 of the second pixel group Pix2 based on the input gradation values SiR, SiG, and SiB of the first pixel group Pix1.

The first processing circuit 110 performs the same process as that illustrated in FIG. 12 and outputs the output gradation values SoRa, SoRb1, SoG, and SoB to the second processing circuit 120. The second processing circuit 120 compares the drive current corresponding to the output gradation value SoRb1 received from the first processing circuit 110 with a predetermined threshold current and sets an output gradation value SoRb2 based on the comparison result. The signal processing circuit 100A outputs the set output gradation value SoRb2 to the pixel Pix. Specifically, the second processing circuit 120 calculates the drive current to be supplied to the second light emitting element 3Rb based on the output gradation value SoRb1. The second processing circuit 120 sets the output gradation value SoRb2 such that the drive current of the second light emitting element 3Rb does not exceed the predetermined threshold current. More specifically, if the drive current exceeds the predetermined threshold current, the second processing circuit 120 divides the output gradation value SoRb1 into a reference gradation value SotRb and a retention gradation value SorRb and sets the reference gradation value SotRb as the output gradation value SoRb2. The reference gradation value SotRb is a gradation value corresponding to the threshold current or the drive current equal to or lower than the threshold current. The reference gradation value SotRb is set as the output gradation value SoRb2 and output to a second light emitting element 3Rb1 of the first pixel group Pix1. The retention gradation value SorRb is input to the memory 115.

If the retention gradation value SorRb is retained in the memory 115, the second processing circuit 120 sets the output gradation value SoRb2 based on the retention gradation value SorRb and the gradation value SioRb based on the input gradation value SiR of the second pixel group Pix2. If the gradation value SioRb corresponding to the input gradation value SiR of the first pixel group Pix1 is divided into the reference gradation value SotRb and the retention gradation value SorRb, the output gradation value SoRb2 is set such that the luminance obtained when the second light emitting element 3Rb1 is caused to emit light with the output gradation value SoRb1 is substantially equal to the luminance obtained when the second light emitting element 3Rb1 and a second light emitting element 3Rb2 of the second pixel group Pix2 are caused to emit light with the reference gradation value SotRb and the retention gradation value SorRb. The output gradation value SoRb2 for the second light emitting element 3Rb2 of the second pixel group Pix2 is set based on the gradation value SioRb based on the input gradation value SiR of the second pixel group Pix2 and on the retention gradation value SorRb obtained by dividing the gradation value SioRb based on the input gradation value SiR of the first pixel group Pix1.

Detailed explanation of the processing from Step ST21 to Step ST26 and from Step ST7 to Step ST13 in FIG. 14 is omitted because it is the same as that illustrated in FIG. 12. As illustrated in FIG. 14, after the processing at Step ST23 or ST25 is completed, the second processing circuit 120 receives the output gradation value SoRb1 from the first processing circuit 110 and determines whether the retention gradation value SorRb is retained in the memory 115 (Step ST31). If the retention gradation value SorRb is retained in the memory 115 (Yes at Step ST31), the second processing circuit 120 sets the retention gradation value SorRb as the output gradation value SoRb2 (Step ST32). The set output gradation value SoRb2 is output to the pixel Pix, thereby turning on the second light emitting element 3Rb included in the pixel Pix. If the retention gradation value SorRb is not retained in the memory 115 (No at Step ST31), the second processing circuit 120 sets the output gradation value SoRb1 (gradation value of 0) as the output gradation value SoRb2 (Step ST33). The set output gradation value SoRb2 is output to the pixel Pix, thereby bringing the second light emitting element 3Rb included in the pixel Pix into the OFF state.

After the processing at Step ST26 is completed, the second processing circuit 120 receives the output gradation value SoRb1 from the first processing circuit 110 and determines whether the retention gradation value SorRb is retained in the memory 115 (Step ST34). If the retention gradation value SorRb is retained in the memory 115 (Yes at Step ST34), the second processing circuit 120 adds the retention gradation value SorRb to the output gradation value SoRb1 (gradation value SioRb based on the input gradation value SiR) (Step ST35). If the retention gradation value SorRb is not retained in the memory 115 (No at Step ST34), the second processing circuit 120 determines whether the drive current corresponding to the output gradation value SoRb1 (gradation value SioRb) is equal to or lower than the threshold current (Step ST36).

If the drive current corresponding to the output gradation value SoRb1 is equal to or lower than the threshold current (Yes at Step ST36), the second processing circuit 120 sets the output gradation value SoRb1 as the output gradation value SoRb2 (Step ST37). The set output gradation value SoRb2 is output to the pixel Pix, thereby turning on the second light emitting element 3Rb included in the pixel Pix.

After the processing at Step ST35 is completed, the second processing circuit 120 determines whether the drive current corresponding to the output gradation value SoRb1 to which the retention gradation value SorRb is added (gradation value SioRb+retention gradation value SorRb) is equal to or lower than the threshold current (Step ST36). If the drive current corresponding to the output gradation value SoRb1 is equal to or lower than the threshold current (Yes at Step ST36), the second processing circuit 120 sets the output gradation value SoRb1 to which the retention gradation value SorRb is added, as the output gradation value SoRb2 (Step ST37). The set output gradation value SoRb2 is output to the pixel Pix, thereby turning on the second light emitting element 3Rb included in the pixel Pix at the gradation corresponding to the output gradation value SoRb1 to which the retention gradation value SorRb is added.

If the drive current corresponding to the output gradation value SoRb1 is higher than the threshold current (No at Step ST36), the second processing circuit 120 sets the reference gradation value SotRb smaller than the output gradation value SoRb1 (gradation value SioRb) as the output gradation value SoRb2 (Step ST38). More specifically, the second processing circuit 120 calculates the reference gradation value SotRb and the retention gradation value SorRb based on the output gradation value SoRb1 and sets the reference gradation value SotRb as the output gradation value SoRb2. After the processing at Step ST38 is completed, the second processing circuit 120 records the retention gradation value SorRb in the memory 115 (Step ST39). The set output gradation value SoRb2 is output to the pixel Pix, thereby turning on the second light emitting element 3Rb included in the pixel Pix.

After the processing at Step ST35 is completed, if the drive current corresponding to the output gradation value SoRb1 to which the retention gradation value SorRb is added (gradation value SioRb+retention gradation value SorRb) is higher than the threshold current (No at Step ST36), the second processing circuit 120 sets the reference gradation value SotRb smaller than the output gradation value SoRb1 to which the retention gradation value SorRb is added, as the output gradation value SoRb2 (Step ST38). More specifically, the second processing circuit 120 calculates the reference gradation value SotRb and the retention gradation value SorRb based on the output gradation value SoRb1 to which the retention gradation value SorRb is added and sets the reference gradation value SotRb as the output gradation value SoRb2 (Step ST38). After the processing at Step ST38 is completed, the second processing circuit 120 records the retention gradation value SorRb in the memory 115 (Step ST39). The set output gradation value SoRb2 is output to the pixel Pix, thereby turning on the second light emitting element 3Rb included in the pixel Pix.

After the processing at Step ST32, ST33, ST37, or ST39 is completed, the signal processing circuit 100A performs the processing from Step ST7 to Step ST13 in the same manner as the procedure illustrated in FIG. 12. The execution order of Steps ST can be appropriately modified, and the signal processing circuit 100A may simultaneously perform the processing at Step ST38 and Step ST39 or perform the processing at Step ST39 before the processing at Step ST38, for example. While the signal processing circuit 100A compares the drive current corresponding to the output gradation value SoRb1 with the threshold current at Step ST36, the present modification is not limited thereto. The signal processing circuit 100A may record the reference gradation value SotRb corresponding to the threshold current and determine whether the output gradation value SoRb1 is equal to or smaller than the reference gradation value SotRb. The reference gradation value SotRb may be a value common to all the pixels Pix or be a different value for each pixel Pix.

In the second modification, when the drive current to be supplied to the second light emitting element 3Rb calculated based on the input gradation value Si of the first pixel group Pix1 is higher than the threshold current, the second light emitting element 3Rb of the first pixel group Pix1 is turned on with the output gradation value (reference gradation value SotRb) smaller than a gradation value SioRb1 corresponding to the input gradation value SiR, and the retention gradation value SorRb is retained. To set the output gradation value So of the adjacent second pixel group Pix2, the second modification adds the retention gradation value SorRb, thereby turning on the second light emitting element 3Rb with the output gradation value (gradation value SioRb2+retention gradation value SorRb) larger than the gradation value SioRb2 corresponding to the input gradation value SiR. Consequently, the two second light emitting elements 3Rb of the first pixel group Pix1 and the second pixel group Pix2 disposed adjacent to each other maintain the total emission intensity, and the drive current flowing through the second light emitting element 3Rb of the first pixel group Pix1 can be reduced.

Third Modification

Figure 15:
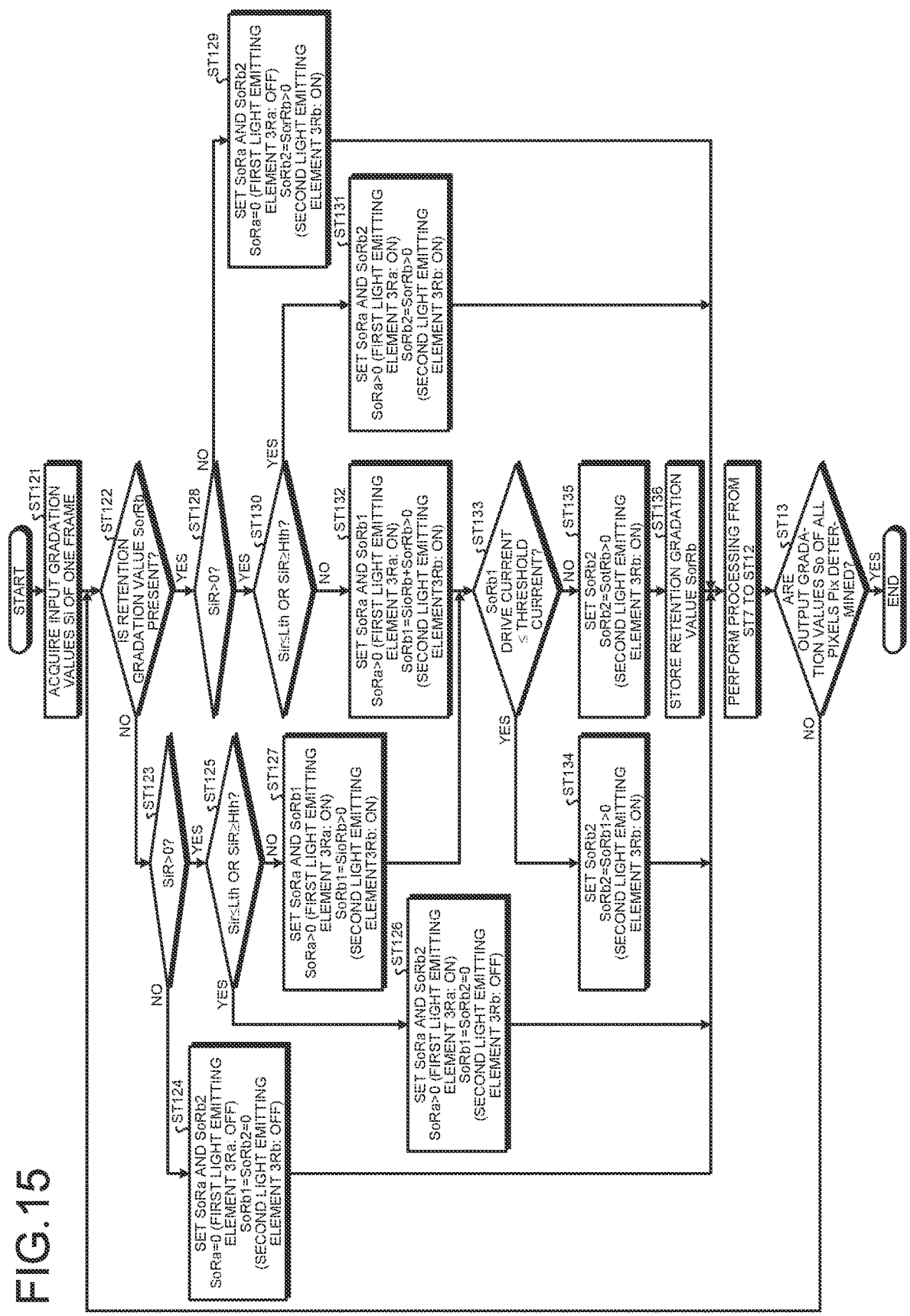
FIG. 15 is a flowchart for explaining the method for setting the output gradation values of the light emitting elements according to a third modification.

FIG. 15 is a flowchart for explaining the method for setting the output gradation values of the light emitting elements according to a third modification. While the first processing circuit 110 performs the processing from Step ST22 to Step ST26, and the second processing circuit 120 performs the processing from Step ST31 to Step ST39 in the second modification, the present embodiment is not limited thereto. The processing performed by the first processing circuit 110 and that performed by the second processing circuit 120 may be switched. In the third modification, the first processing circuit 110 determines whether the retention gradation value SorRb is retained in the memory 115. Descriptions common to the second modification are omitted at Steps ST.

The first processing circuit 110 acquires the input gradation values Si of one frame (Step ST121) and determines whether the retention gradation value SorRb is retained in the memory 115 (Step ST122). If the retention gradation value SorRb is not retained in the memory 115 (No at Step ST122), the first processing circuit 110 performs the same processing as that from Step ST2 to Step ST6 in FIG. 12. Specifically, if the input gradation value SiR is 0 (No at Step ST123) or if the input gradation value SiR is equal to or smaller than the first threshold Lth or equal to or larger than the second threshold Hth (Yes at Step ST125), the first processing circuit 110 sets a gradation value of 0 as the output gradation value SoRb2 without the second processing circuit 120 (Steps ST124 and ST126). If the input gradation value SiR is larger than the first threshold Lth and smaller than the second threshold Hth (No at Step ST125), the first processing circuit 110 outputs, to the second processing circuit 120, the gradation value SioRb based on the input gradation value SiR as the output gradation value SoRb1 (Step ST127).

If the retention gradation value SorRb is retained in the memory 115 (Yes at Step ST122), the first processing circuit 110 adds the retention gradation value SorRb and performs the same processing as that from Step ST123 to Step ST127. The first processing circuit 110 determines whether the input gradation value SiR is larger than 0 (Step ST128). Specifically, if the input gradation value SiR is 0 (No at Step ST128) or if the input gradation value SiR is equal to or smaller than the first threshold Lth or equal to or larger than the second threshold Hth (Yes at Step ST130), the first processing circuit 110 sets the retention gradation value SorRb as the output gradation value SoRb2 without the second processing circuit 120 (Steps ST129 and ST131). If the input gradation value SiR is larger than the first threshold Lth and smaller than the second threshold Hth (No at Step ST130), the first processing circuit 110 outputs a value obtained by adding the retention gradation value SorRb to the gradation value SioRb based on the input gradation value SiR to the second processing circuit 120 as the output gradation value SoRb1 (Step ST132).

After receiving the output gradation value SoRb1 from the first processing circuit 110 (Steps ST132 and ST127), the second processing circuit 120 performs the same processing as that from Step ST36 to Step ST39 in FIG. 14. Specifically, the second processing circuit 120 determines whether the drive current corresponding to the output gradation value SoRb1 is equal to or lower than the threshold current (Step ST133). If the drive current corresponding to the output gradation value SoRb1 is equal to or lower than the threshold current (Yes at Step ST133), the second processing circuit 120 sets the output gradation value SoRb1 as the output gradation value SoRb2 (Step ST134). If the drive current corresponding to the output gradation value SoRb1 is higher than the threshold current (No at Step ST133), the second processing circuit 120 divides the output gradation value SoRb1 into the reference gradation value SotRb and the retention gradation value SorRb and sets the reference gradation value SotRb as the output gradation value SoRb2 (Step ST135). The second processing circuit 120 records the retention gradation value SorRb in the memory 115 (Step ST136).

After the processing at Step ST124, ST126, ST129, ST131, ST134, or ST136 is completed, the signal processing circuit 100A performs the processing from Step ST7 to Step ST13 in the same manner as the procedure illustrated in FIG. 12.

As described above, the first processing circuit 110 determines whether the retention gradation value SorRb is retained. Consequently, the third modification can complete the processing at part of Steps ST (Steps ST124, ST126, ST129, and ST131) without the second processing circuit 120, thereby performing the processing in a simpler manner.

Fourth Modification

Figure 16A:
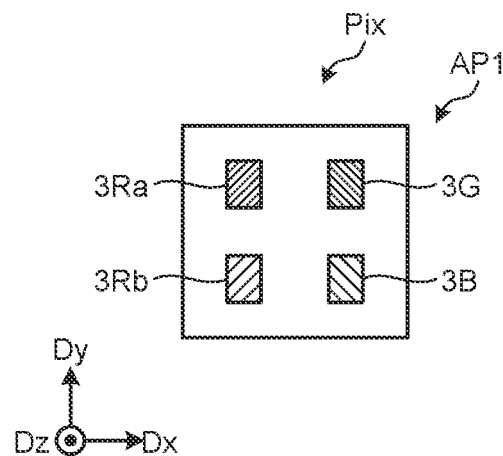
FIG. 16A is a plan view of a first arrangement pattern of the light emitting elements in one pixel group according to a fourth modification.
Figure 16B:
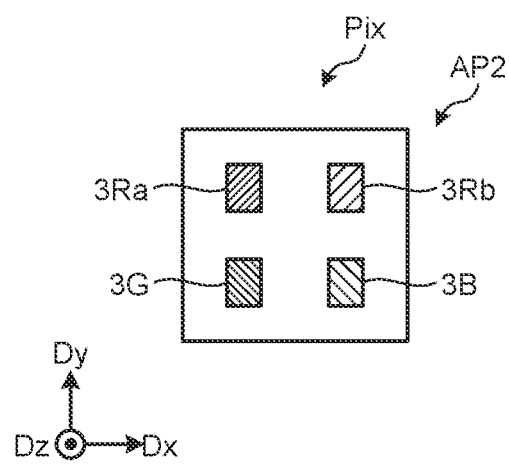
FIG. 16B is a plan view of a second arrangement pattern of the light emitting elements in one pixel group.
Figure 16C:
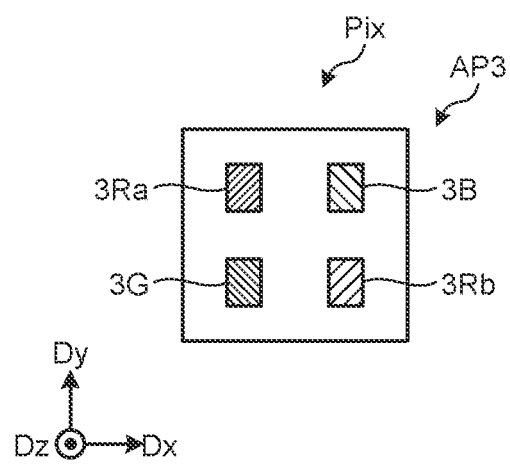
FIG. 16C is a plan view of a third arrangement pattern of the light emitting elements in one pixel group.

FIGS. 16A to 16C are plan views of a modification of the arrangement pattern of the light emitting elements in one pixel group. In the embodiment, the first light emitting element 3Ra, the second light emitting element 3Rb, the third light emitting element 3G, and the fourth light emitting element 3B are disposed in one pixel Pix as illustrated in FIG. 2; however, the arrangement pattern of the light emitting elements 3 is not limited thereto. FIG. 16A is a plan view of a first arrangement pattern of the light emitting elements in one pixel group according to a fourth modification. In a first arrangement pattern AP1 illustrated in FIG. 16A, the first light emitting element 3Ra and the second light emitting element 3Rb are disposed in the second direction Dy. The first light emitting element 3Ra and the third light emitting element 3G are disposed in the first direction Dx. The second light emitting element 3Rb and the fourth light emitting element 3B are disposed in the first direction Dx. The third light emitting element 3G and the fourth light emitting element 3B are disposed in the second direction Dy.

In the first arrangement pattern AP1, the positions of the first light emitting element 3Ra and the second light emitting element 3Rb may be switched, or the positions of the third light emitting element 3G and the fourth light emitting element 3B may be switched. The first light emitting element 3Ra or the third light emitting element 3G having a wavelength close to that of the second light emitting element 3Rb is preferably disposed at a position adjacent to the second light emitting element 3Rb in the first direction Dx or the second direction.

FIG. 16B is a plan view of a second arrangement pattern of the light emitting elements in one pixel group. In a second arrangement pattern AP2 illustrated in FIG. 16B, the first light emitting element 3Ra and the second light emitting element 3Rb are disposed in the first direction Dx. The first light emitting element 3Ra and the third light emitting element 3G are disposed in the second direction Dy. The second light emitting element 3Rb and the fourth light emitting element 3B are disposed in the second direction Dy. The third light emitting element 3G and the fourth light emitting element 3B are disposed in the first direction Dx.

In the second arrangement pattern AP2, the positions of the first light emitting element 3Ra and the second light emitting element 3Rb may be switched, or the positions of the third light emitting element 3G and the fourth light emitting element 3B may be switched. Alternatively, the positions of the first light emitting element 3Ra and the second light emitting element 3Rb may be switched, and the positions of the third light emitting element 3G and the fourth light emitting element 3B may be switched. In other words, the first light emitting element 3Ra and the second light emitting element 3Rb are disposed in the first direction Dx, and the second light emitting element 3Rb and the third light emitting element 3G or the fourth light emitting element 3B are disposed in the second direction Dy. The first light emitting element 3Ra or the third light emitting element 3G having a wavelength close to that of the second light emitting element 3Rb is preferably disposed at a position adjacent to the second light emitting element 3Rb in the first direction Dx or the second direction.

FIG. 16C is a plan view of a third arrangement pattern of the light emitting elements in one pixel group. In a third arrangement pattern AP3 illustrated in FIG. 16C, the first light emitting element 3Ra and the fourth light emitting element 3B are disposed in the first direction Dx. The first light emitting element 3Ra and the third light emitting element 3G are disposed in the second direction Dy. The fourth light emitting element 3B and the second light emitting element 3Rb are disposed in the second direction Dy. The third light emitting element 3G and the second light emitting element 3Rb are disposed in the first direction Dx. In other words, the first light emitting element 3Ra and the second light emitting element 3Rb are arrayed in a diagonal direction intersecting both the first direction Dx and the second direction Dy.

In the third arrangement pattern AP3, the positions of the first light emitting element 3Ra and the second light emitting element 3Rb may be switched, or the positions of the third light emitting element 3G and the fourth light emitting element 3B may be switched. Alternatively, the positions of the first light emitting element 3Ra and the second light emitting element 3Rb may be switched, and the positions of the third light emitting element 3G and the fourth light emitting element 3B may be switched. In other words, the first light emitting element 3Ra and one of the third light emitting element 3G and the fourth light emitting element 3B are disposed in the first direction Dx. The second light emitting element 3Rb and one of the third light emitting element 3G and the fourth light emitting element 3B are disposed in the second direction Dy.

Fifth Modification

Figure 17A:
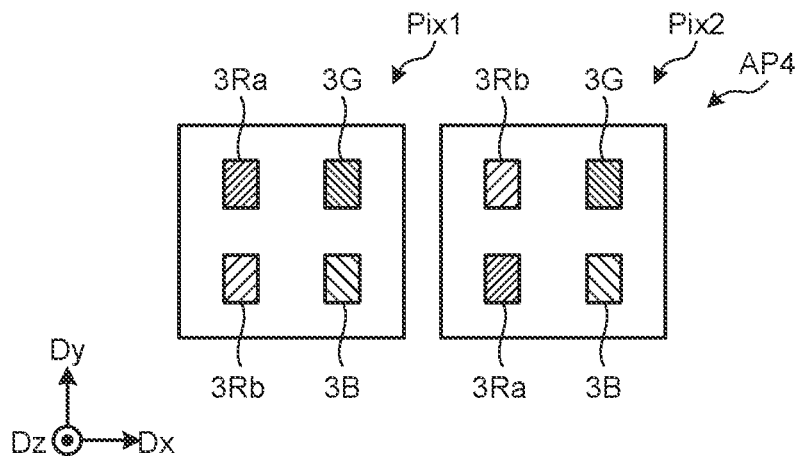
FIG. 17A is a plan view of a fourth arrangement pattern of the light emitting elements in two pixel groups according to a fifth modification.
Figure 17B:
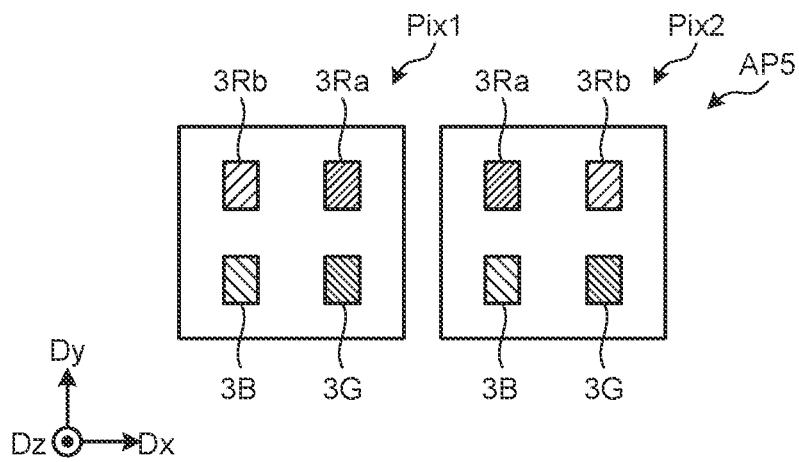
FIG. 17B is a plan view of a fifth arrangement pattern of the light emitting elements in two pixel groups.
Figure 17C:
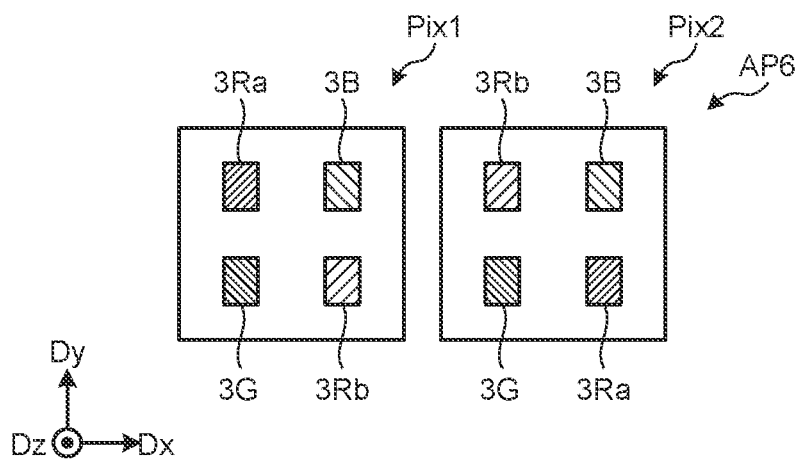
FIG. 17C is a plan view of a sixth arrangement pattern of the light emitting elements in two pixel groups.

FIGS. 17A to 17C are plan views of a modification of the arrangement pattern of the light emitting elements in two pixel groups. The embodiment and the fourth modification have described the arrangement patterns of the light emitting elements. If all the pixels Pix disposed in a matrix (row-column configuration) have one of the arrangement patterns, the first light emitting elements 3Ra, the second light emitting elements 3Rb, the third light emitting elements 3G, and the fourth light emitting elements 3B are each disposed in a certain direction. If the pixels likely to be brought into the OFF state, such as the second light emitting elements 3Rb, are arrayed in one direction, they may possibly be visually recognized as streaks and unevenness. To address this, in the fifth modification, two kinds of pixels Pix having different arrangement patterns of the light emitting elements 3 are arranged. With this configuration, the fifth modification can hamper streaks and unevenness from being visually recognized.

FIG. 17A is a plan view of a fourth arrangement pattern of the light emitting elements in two pixel groups according to a fifth modification. In a fourth arrangement pattern AP4 illustrated in FIG. 17A, the first pixel group Pix1 and the second pixel group Pix2 disposed in the first direction Dx are different in the arrangement pattern of the light emitting elements 3. The first pixel group Pix1 on the left in FIG. 17A has the same arrangement pattern of the light emitting elements 3 as the first arrangement pattern AP1 illustrated in FIG. 16A. The second pixel group Pix2 on the right in FIG. 17A has an arrangement pattern obtained by switching the positions of the first light emitting element 3Ra and the second light emitting element 3Rb in the first pixel group Pix1. As described above, the positions of the light emitting elements 3 may differ between the pixels Pix.

FIG. 17B is a plan view of a fifth arrangement pattern of the light emitting elements in two pixel groups. In a fifth arrangement pattern AP5 illustrated in FIG. 17B, the first pixel group Pix1 and the second pixel group Pix2 have arrangement patterns of the light emitting elements 3 similar to the second arrangement pattern AP2 illustrated in FIG. 16B. The first pixel group Pix1 on the left in FIG. 17B has an arrangement pattern obtained by switching the positions of the first light emitting element 3Ra and the second light emitting element 3Rb and switching the positions of the third light emitting element 3G and the fourth light emitting element 3B in the second arrangement pattern AP2 illustrated in FIG. 16B. The second pixel group Pix2 on the right in FIG. 17B has an arrangement pattern obtained by switching the positions of the first light emitting element 3Ra and the second light emitting element 3Rb in the first pixel group Pix1.

FIG. 17C is a plan view of a sixth arrangement pattern of the light emitting elements in two pixel groups. In a sixth arrangement pattern AP6 illustrated in FIG. 17C, the first pixel group Pix1 and the second pixel group Pix2 have arrangement patterns of the light emitting elements 3 similar to the third arrangement pattern AP3 illustrated in FIG. 16C. The first pixel group Pix1 on the left in FIG. 17C has the same arrangement pattern of the light emitting elements 3 as the third arrangement pattern AP3 illustrated in FIG. 16C. The second pixel group Pix2 on the right in FIG. 17C has an arrangement pattern obtained by switching the positions of the first light emitting element 3Ra and the second light emitting element 3Rb in the first pixel group Pix1.

Sixth Modification

Figure 18:
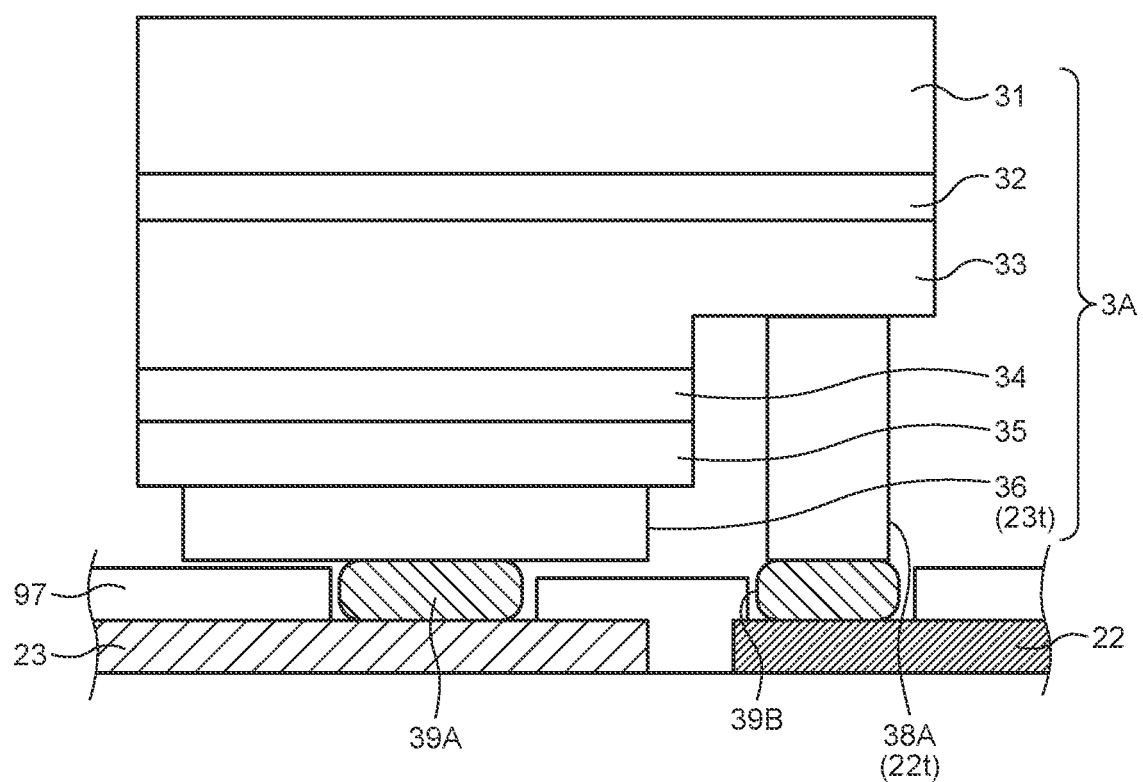
FIG. 18 is a sectional view of the light emitting element according to a sixth modification.

FIG. 18 is a sectional view of the light emitting element according to a sixth modification. In the display device 1, the light emitting element 3 does not necessarily have a face-up structure. Alternatively, the light emitting element 3 may have what is called a face-down structure in which the lower part of the light emitting element 3 is coupled to the anode electrode 23 and the cathode electrode 22.

As illustrated in FIG. 18, in a light emitting element 3A, a buffer layer 32, the n-type cladding layer 33, the light emitting layer 34, the p-type cladding layer 35, and a p-type electrode 36 are layered on a translucent substrate 31 in the order as listed. In the light emitting element 3A, the translucent substrate 31 is provided at the upper part, and the p-type electrode 36 is provided at the lower part. The surface of the n-type cladding layer 33 facing the cathode electrode 22 has a region exposed from the light emitting layer 34. This region is provided with an n-type electrode 38A.

The p-type electrode 36 is made of material having metallic luster that reflects light from the light emitting layers. The p-type electrode 36 is coupled to the anode electrode 23 with a bump 39A interposed therebetween. The n-type electrode 38A is coupled to the cathode electrode 22 with a bump 39B interposed therebetween. An insulating film 97 covers the cathode electrode 22 and the anode electrode 23. The bumps 39A and 39B are coupled to the anode electrode 23 and the cathode electrode 22, respectively, through openings in the insulating film 97.

In the light emitting element 3A, the p-type cladding layer 35 and the n-type cladding layer 33 are not directly bonded, and another layer (light emitting layer 34) is interposed therebetween. This configuration can concentrate carriers, such as electrons and holes, in the light emitting layer 34, thereby efficiently recombining the carriers (emitting light). In the first light emitting element 3Ra according to the present modification, the light emitting layer 34 is made of GaN to which Eu is added. In the second light emitting element 3Rb, the light emitting layer 34 includes a multi-quantum well structure (MQW structure) in which well layers and barrier layers composed of several atomic layers are cyclically stacked. The third light emitting element 3G and the fourth light emitting element 3B may include a single-layered light emitting layer 34 like the first light emitting element 3Ra or a multilayered light emitting layer 34 like the second light emitting element 3Rb.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiment above and the modifications thereof.

What is claimed is:

1. A display device comprising:
    a substrate;
    a plurality of pixels provided on the substrate; and
    a first light emitting element and a second light emitting element that are included in each of the pixels, wherein
    a light emitting layer of the first light emitting element includes gallium nitride to which europium is added, and
    a light emitting layer of the second light emitting element includes a multi-quantum well structure in which indium gallium nitride and gallium nitride are layered.

2. The display device according to claim 1, wherein
    the first light emitting element is configured to output first red light,
    the second light emitting element is configured to output second red light, and
    a half width of a spectrum of the first red light is less than a half width of a spectrum of the second red light.

3. The display device according to claim 1, further comprising:
    a third light emitting element configured to output green light; and
    a fourth light emitting element configured to output blue light, wherein
    the first light emitting element and the second light emitting element are disposed in a first direction, and
    the second light emitting element and the third light emitting element or the fourth light emitting element are disposed in a second direction intersecting the first direction.

4. The display device according to claim 1, further comprising:
    a third light emitting element configured to output green light; and
    a fourth light emitting element configured to output blue light, wherein
    the first light emitting element and one of the third light emitting element and the fourth light emitting element are disposed in a first direction, and
    the second light emitting element and the one of the third light emitting element and the fourth light emitting element are disposed in a second direction intersecting the first direction.

5. The display device according to claim 1, wherein
    the first light emitting element is turned on when an input gradation value of the pixel is equal to or smaller than a first threshold, and
    the first light emitting element and the second light emitting element are turned on when the input gradation value of the pixel is larger than the first threshold and smaller than a second threshold that is larger than the first threshold.

6. The display device according to claim 5, wherein the first light emitting element is turned on when the input gradation value of the pixel is equal to or larger than the second threshold.

7. The display device according to claim 1, further comprising:
    a first pixel group and a second pixel group each including the first light emitting element and the second light emitting element and disposed adjacent to each other, wherein
    when a drive current to be supplied to the second light emitting element calculated based on the input gradation value of the first pixel group is higher than a threshold current, the second light emitting element of the first pixel group is turned on with an output gradation value smaller than a gradation value corresponding to an input gradation value, and the second light emitting element of the second pixel group is turned on with an output gradation value larger than the gradation value corresponding to an input gradation value.

8. The display device according to claim 1, wherein the multi-quantum well structure includes first layers formed of indium gallium nitride and second layers formed of gallium nitride.

9. A display device comprising:
    a substrate;
    a plurality of pixels provided on the substrate; and
    a first light emitting element and a second light emitting element that are included in each of the pixels, wherein
    the first light emitting element is configured to output first red light,
    the second light emitting element is configured to output second red light, and
    a half width of a spectrum of the first red light is less than a half width of a spectrum of the second red light.

10. The display device according to claim 9, wherein
    a light emitting layer of the first light emitting element includes gallium nitride to which europium is added.

11. The display device according to claim 9, wherein
    a light emitting layer of the second light emitting element includes a multi-quantum well structure in which indium gallium nitride and gallium nitride are layered.

12. The display device according to claim 11, wherein the multi-quantum well structure includes first layers formed of indium gallium nitride and second layers formed of gallium nitride.

* * * * *